United States Patent
Hamaguchi et al.

(10) Patent No.: US 9,705,066 B2
(45) Date of Patent: Jul. 11, 2017

(54) HEAD AND LIQUID EJECTING APPARATUS

(71) Applicant: SEIKO EPSON CORPORATION, Tokyo (JP)

(72) Inventors: Toshiaki Hamaguchi, Fujimi-machi (JP); Eiju Hirai, Minowa-machi (JP); Yoichi Naganuma, Matsumoto (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/015,994

(22) Filed: Feb. 4, 2016

(65) Prior Publication Data
US 2016/0263890 A1  Sep. 15, 2016

(30) Foreign Application Priority Data
Mar. 10, 2015  (JP) .................................. 2015-047693

(51) Int. Cl.
*H01L 41/047* (2006.01)
*H01L 41/04* (2006.01)
*B41J 2/16* (2006.01)
*B41J 2/14* (2006.01)

(52) U.S. Cl.
CPC ...... *H01L 41/0471* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1645* (2013.01); *H01L 41/042* (2013.01); *B41J 2002/14241* (2013.01); *B41J 2002/14491* (2013.01); *B41J 2202/18* (2013.01)

(58) Field of Classification Search
CPC ................ B41J 2/14201; B41J 2/04501; B41J 2002/14491; H01L 1/0471; H01L 1/042
See application file for complete search history.

(56) References Cited

U.S. PATENT DOCUMENTS

| 5,889,539 A | 3/1999 | Kamoi et al. |
| 2013/0147881 A1* | 6/2013 | Redding ............. B41J 2/14233 347/71 |
| 2013/0201258 A1* | 8/2013 | Hirai .................. H01L 41/0471 347/70 |

FOREIGN PATENT DOCUMENTS

| EP | 0755792 A | 1/1997 |
| EP | 0974465 A | 1/2000 |
| JP | 07-169661 A | 7/1995 |
| JP | 09-123449 A | 5/1997 |
| JP | 2000351217 A | * 12/2000 |

(Continued)

*Primary Examiner* — Julian Huffman
*Assistant Examiner* — Sharon A Polk
(74) *Attorney, Agent, or Firm* — Workman Nydegger

(57) ABSTRACT

A head includes a channel formation substrate having two piezoelectric actuator rows formed thereon, a driving circuit, and a driving circuit board which is provided with a first bump and a second bump, in which the first bump is provided on the outside of the piezoelectric actuator row, an adhesive layer is provided on both sides of the first bump and the second bump, a first through hole and a second through hole are provided on the driving circuit board, a first connection wiring and a second connection wiring are provided in the first through hole and the second through hole, and a first electrode of the piezoelectric actuator is electrically connected to a first connection wiring via the first bump and a second electrode is electrically connected to a second connection wiring via the second bump.

8 Claims, 16 Drawing Sheets

(56) References Cited

FOREIGN PATENT DOCUMENTS

| JP | 2002-292871 A | 10/2002 |
|---|---|---|
| JP | 2014-051008 A | 3/2014 |

* cited by examiner

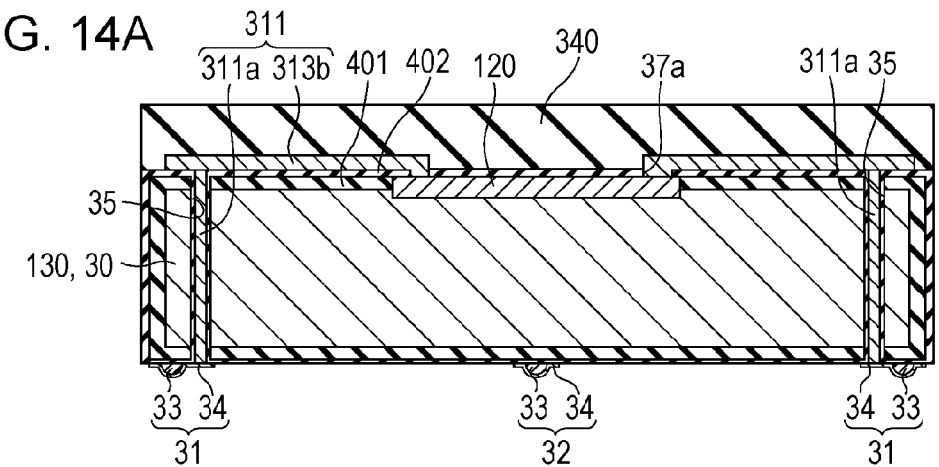
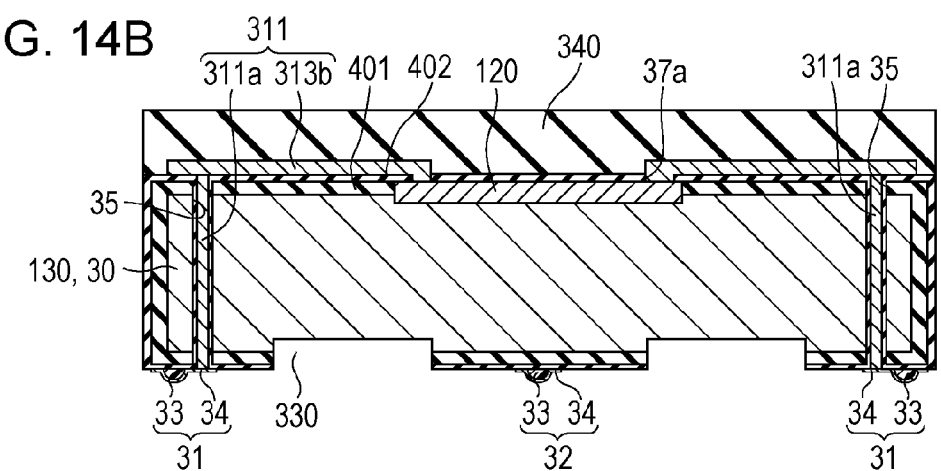
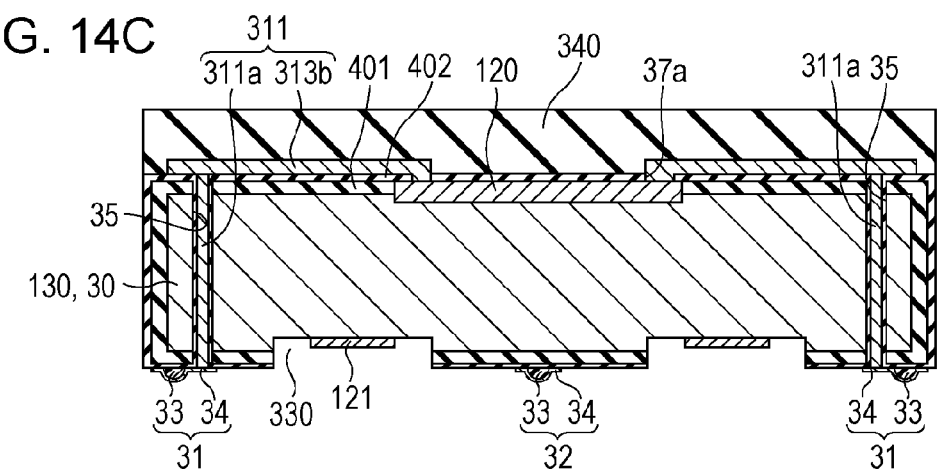

HEAD AND LIQUID EJECTING APPARATUS

CROSS-REFERENCE TO RELATED APPLICATIONS

The present application claims priority to Japanese Patent Application No. 2015-047693 filed on Mar. 10, 2015, which is hereby incorporated by reference in its entirety.

BACKGROUND

1. Technical Field

The present invention relates to a head which ejects a liquid, and a liquid ejecting apparatus which is provided with the head, and particularly relates to an ink jet recording head and an ink jet type recoding apparatus which eject ink as the liquid.

2. Related Art

A piezo ink jet system is an on-demand type ink jet printing system which discharges a liquid droplet by deforming a piezo element through the applying of a voltage to the piezo element (JIS Z8123-1: 2013).

A permanent head is a machine portion or an electrical portion of a printer main body which continuously or intermittently generates a liquid droplet of ink (JIS Z8123-1: 2013).

The permanent head (hereinafter, referred to as a "head") which is used in the piezo ink jet system is provided with a channel formation substrate on which a pressure generating chamber, which communicates with a nozzle for ejecting a liquid droplet is formed, a piezo element which is provided on one surface side of the channel formation substrate, and a driving circuit board in which a driving circuit which is bonded onto the channel formation substrate so as to be close to the piezo element and drives the piezo element is provided. The permanent head ejects the liquid droplet from the nozzle by driving the piezo element by the driving circuit and applying a pressure change to the liquid in the pressure generating chamber.

As the head described above, a head which is configured such that a driving circuit and a bump are provided on a surface of a driving circuit board facing a channel formation substrate, and the driving circuit and the piezo element are electrically connected to each other via the bump has been proposed (for example, refer to JP-A-2014-51008). The driving circuit board and the channel formation substrate are bonded to each other by using an adhesive which is provided in the vicinity of the bump. The bump and the adhesive have a constant height, and are used to form a holding portion which is a space for accommodating the driving circuit and the piezo element between the driving circuit board and the channel formation substrate.

The driving circuit is disposed to face the piezo element which is accommodated in the holding portion (a so-called face down disposition). Since the driving circuit is accommodated in the holding portion, an input portion for inputting signals from an external control circuit to the driving circuit is provided on the outside of the holding portion on the driving circuit board. With such an input portion being provided on the driving circuit board, it is possible to transfer a signal to the driving circuit in the holding portion.

However, since the driving circuit board is required to secure not only an area for the driving circuit but also an area for the input unit, the size of the driving circuit board becomes enlarged. In addition, if the driving circuit board is enlarged, the number of boards obtained from one raw material is decreased, and thus cost is increased.

In addition, such a problem exists in not only a head for ejecting ink, but also a head for ejecting liquid droplets other than the ink.

SUMMARY

An advantage of some aspects of the invention is to provide a head and a liquid ejecting apparatus in which a driving circuit board which forms a holding portion is reduced in size and thus to realize cost reduction.

Aspect 1

According to this aspect of the invention, there is provided a head including: an actuator substrate which has two piezo element rows arranged in a second direction which intersects with a first direction, each of the piezo element rows being formed of piezo elements arranged in the first direction, the piezo element causing a pressure change to occur in a pressure generating chamber communicating with a nozzle opening for ejecting a liquid; a driving circuit board which is provided with a driving circuit for driving the piezo element on a second main surface on the side opposite to a first main surface facing the actuator substrate; and a first bump and a second bump which are provided on any one of the actuator substrate and the driving circuit board, in which the first bump is provided on the outside of the piezo element row in the second direction, an adhesive layer which bonds the actuator substrate to the driving circuit board is provided on at least both sides of the first bump in the second direction, the piezo element includes an individual electrode which is independently provided corresponding to the pressure generating chamber, a common electrode which is common to the piezo element row, and a piezoelectric layer which is provided between the common electrode and the individual electrode, a plurality of first through holes, which communicate with the first main surface and the second main surface, are provided for each individual electrode, and at least one second through hole, which communicates with the first main surface and the second main surface is provided, corresponding to the common electrode, on the driving circuit board, a first connection wiring and a second connection wiring which connect the driving circuit and the piezo element are provided in the first through hole and the second through hole, and the individual electrode and the first connection wiring are electrically connected to each other through the first bump, and the common electrode and the second connection wiring are electrically connected to each other through the second bump.

According to the aspect, the first connection wiring and the second connection wiring are extended to pass through the driving circuit board, and thus it is possible to realize size reduction in the first direction and the second direction. In addition, the common electrode is provided between two piezo element rows. Thus it is sufficient to provide one second bump row which is connected to the common electrode. As a result, it is sufficient to provide three bumps in total including the first bump and the second bump, and thus it is possible to reduce the width of the driving circuit board in the second direction. In this way, it is possible to reduce the size of the driving circuit board, that is, it is possible to reduce the size of the head, and thus the head of the invention can support the nozzle opening with high density and discharge ink with high density.

Aspect 2

Here, in the head according to Aspect 1, it is preferable that the second bump is formed between the piezo element rows. According to this aspect, it is possible to reduce the size of the driving circuit board in the first direction, and thereby to reduce the size of the head.

Aspect 3

In addition, in the head according to Aspect 1 or Aspect 2, it is preferable that the adhesive layer is provided on both sides of the second bump in the second direction. According to this aspect, it is possible to more ensurely maintain the electrical connection between the first bump and the second bump.

Aspect 4

In addition, in the head according to any one of Aspect 1 to Aspect 3, it is preferable that on a surface of the driving circuit board on the actuator substrate side, an accommodating portion having a recessed shape faces the piezo element row and is extended in the second direction, and a wiring is formed in the accommodating portion. According to this aspect, it is possible to provide the wiring in the accommodating portion for various uses, for example, decreasing the electric resistance by connecting the wiring which is provided in the accommodating portion to the wiring having a small current capacity included in the driving circuit. In addition, the wiring can be separated from the piezo element by disposing the wiring in the accommodating portion. With this, it is possible to reduce a risk that displacement of the piezo element is disturbed by the driving circuit board. In addition, it is possible to prevent discharge from occurring between the wiring and the piezo element, and thereby to manufacture the reliable head which protects the piezo element.

Aspect 5

In addition, in the head according to any one of Aspect 1 to Aspect 4, it is preferable that the second bump is extended in the first direction, and at least two second through holes are formed on the outside from both ends of the second bump in the first direction. According to this aspect, it is possible to suppress the variation of the voltage drop of the common electrode by the two second through holes and the two second connection wirings, and to reduce the driving circuit board in the second direction.

Aspect 6

According to this aspect of the invention, there is provided a liquid ejecting apparatus including the head according to any one of Aspect 1 to Aspect 5. According to this aspect, a head and a liquid ejecting apparatus in which, the size of a driving circuit board which forms a holding portion is reduced, are provided and thus it is possible to realize cost reduction.

BRIEF DESCRIPTION OF THE DRAWINGS

The invention will be described with reference to the accompanying drawings, wherein like numbers reference like elements.

FIGS. 14A to 14C are sectional views illustrating the manufacturing method of the head.

DESCRIPTION OF EXEMPLARY EMBODIMENTS

Embodiment 1

The invention will be specifically described based on embodiments. In the present embodiment, an ink jet recording head will be described as an example of a head.

Figure 1:
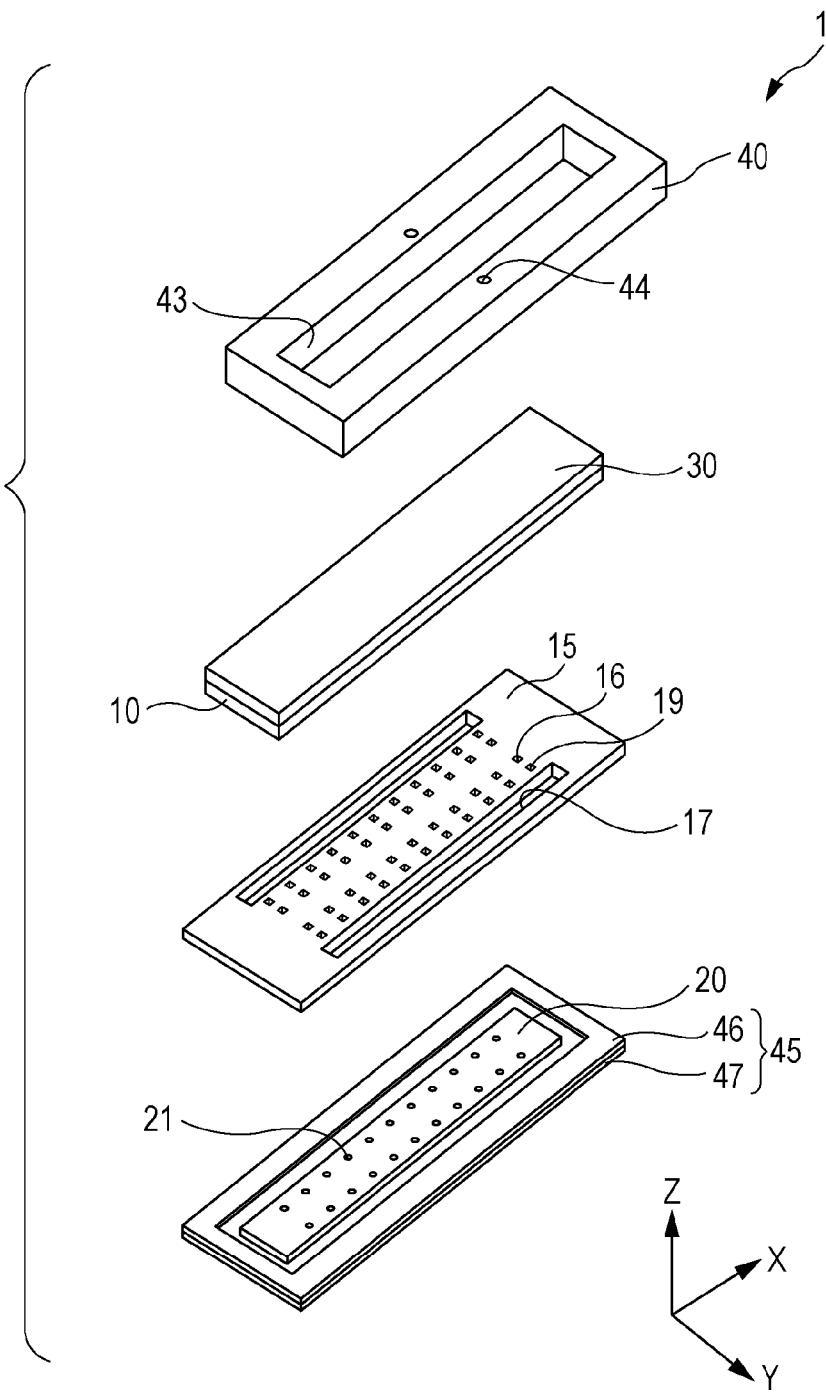
FIG. 1 is an exploded perspective view of a head.
Figure 2:
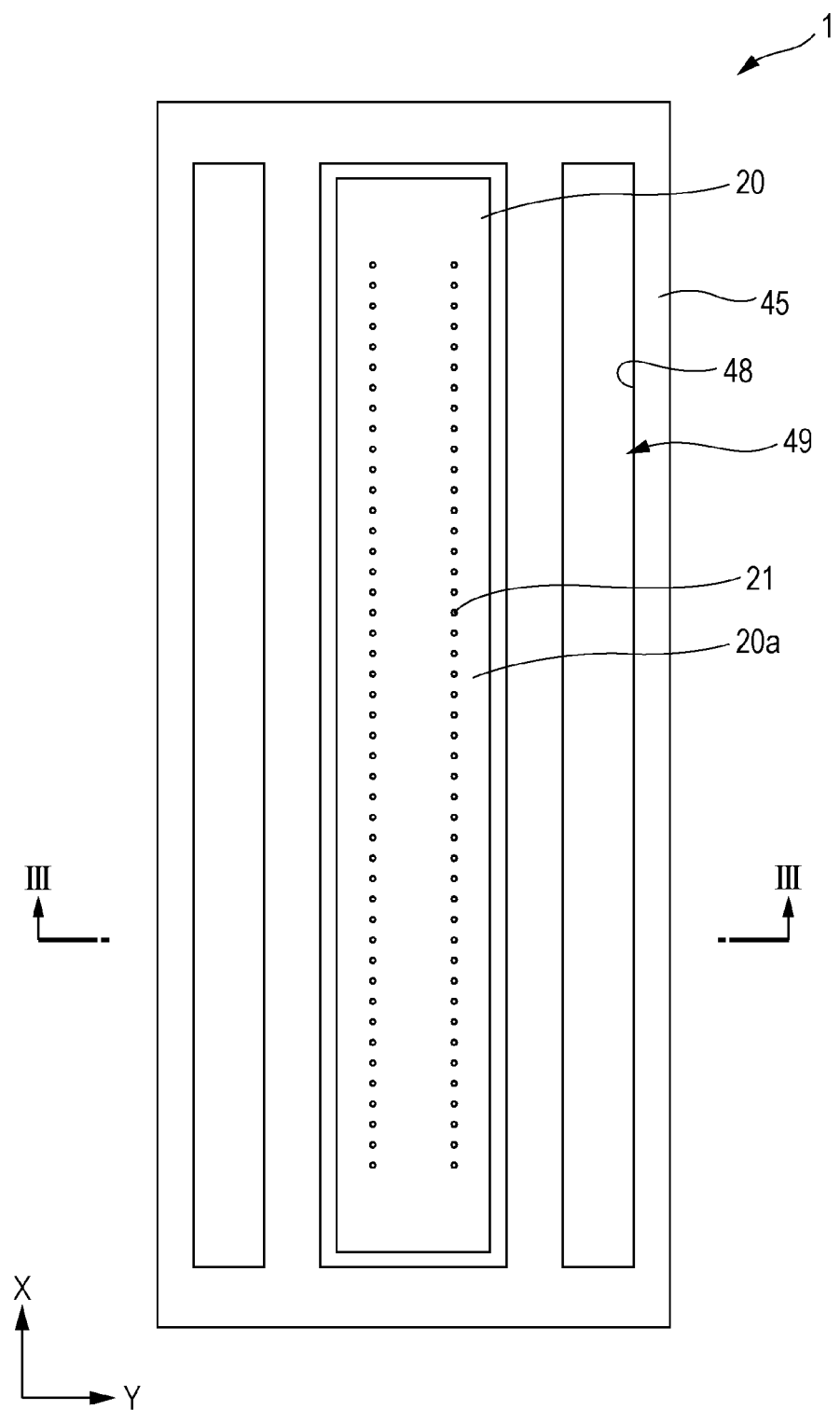
FIG. 2 is a plan view of the head.
Figure 3:
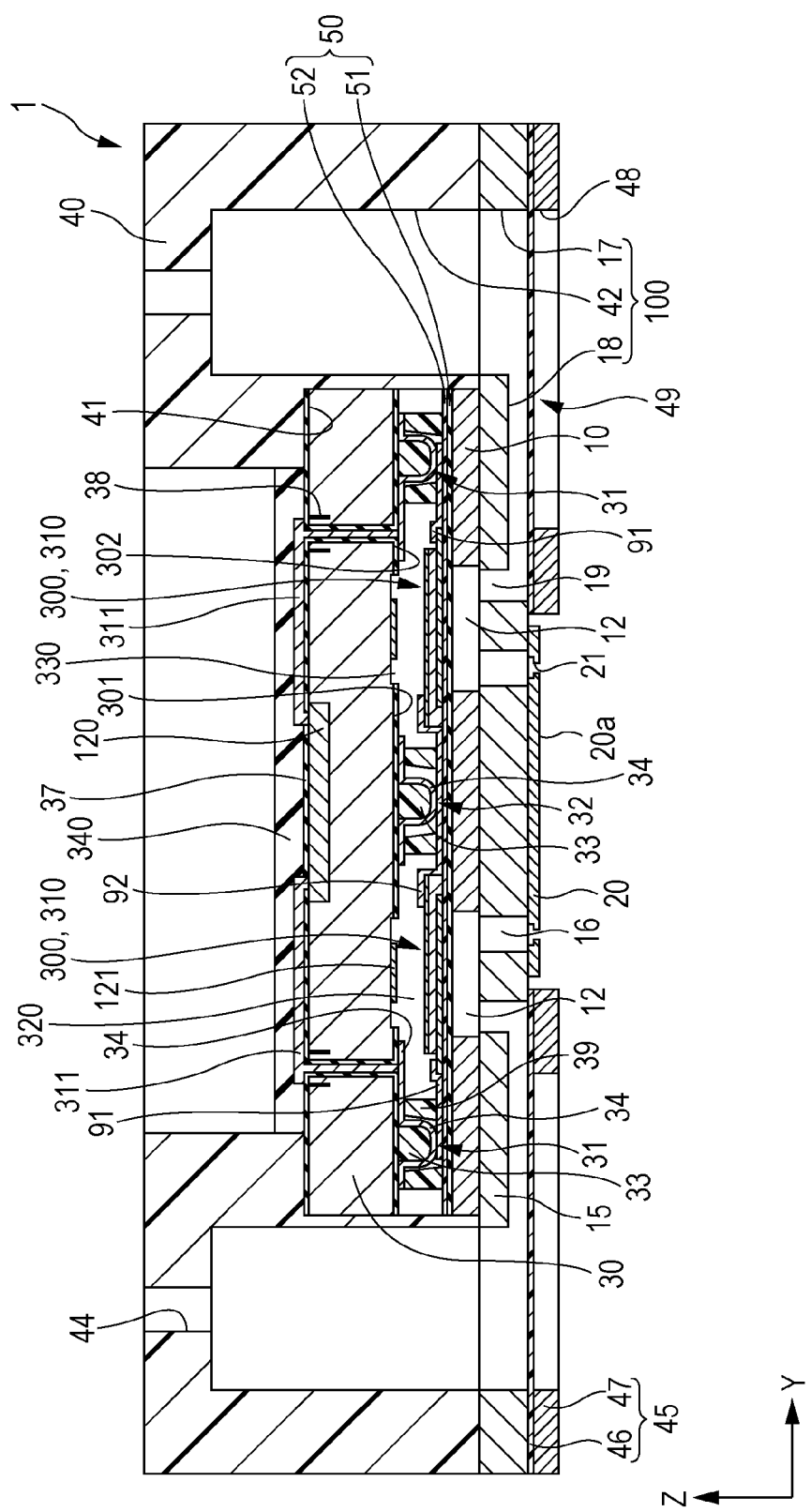
FIG. 3 is an enlarged sectional view taken along line III-III in FIG. 2.
Figure 4:
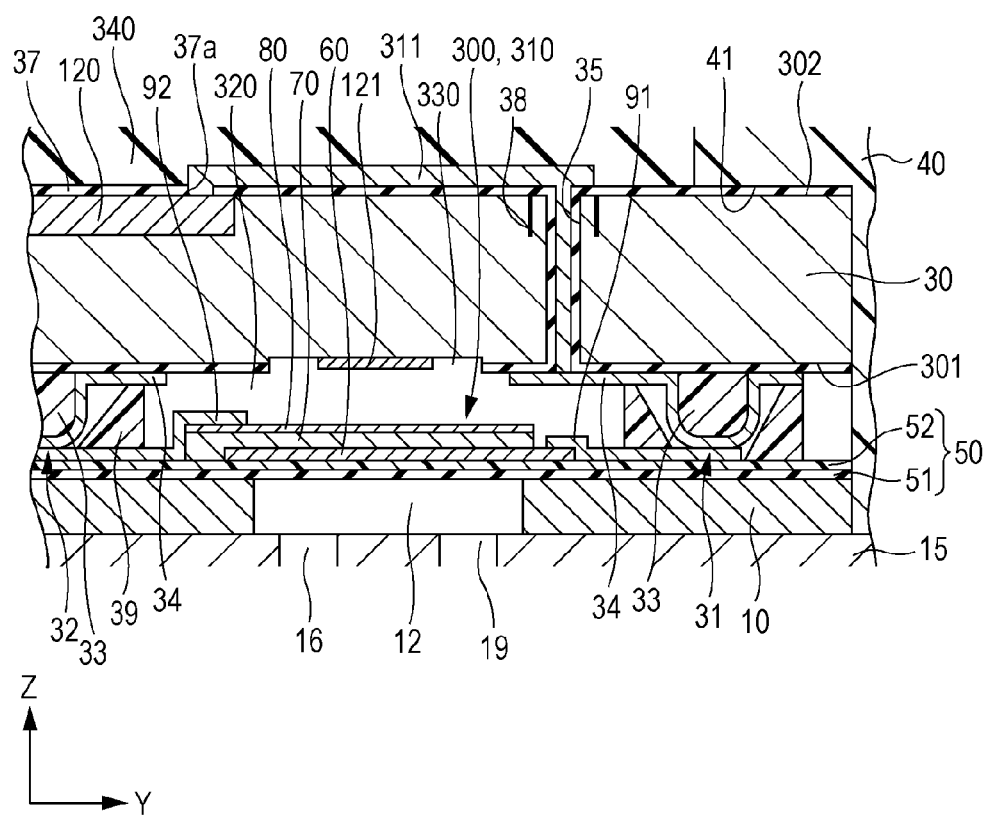
FIG. 4 is an enlarged sectional view illustrating a main portion of FIG. 3.
Figure 5:
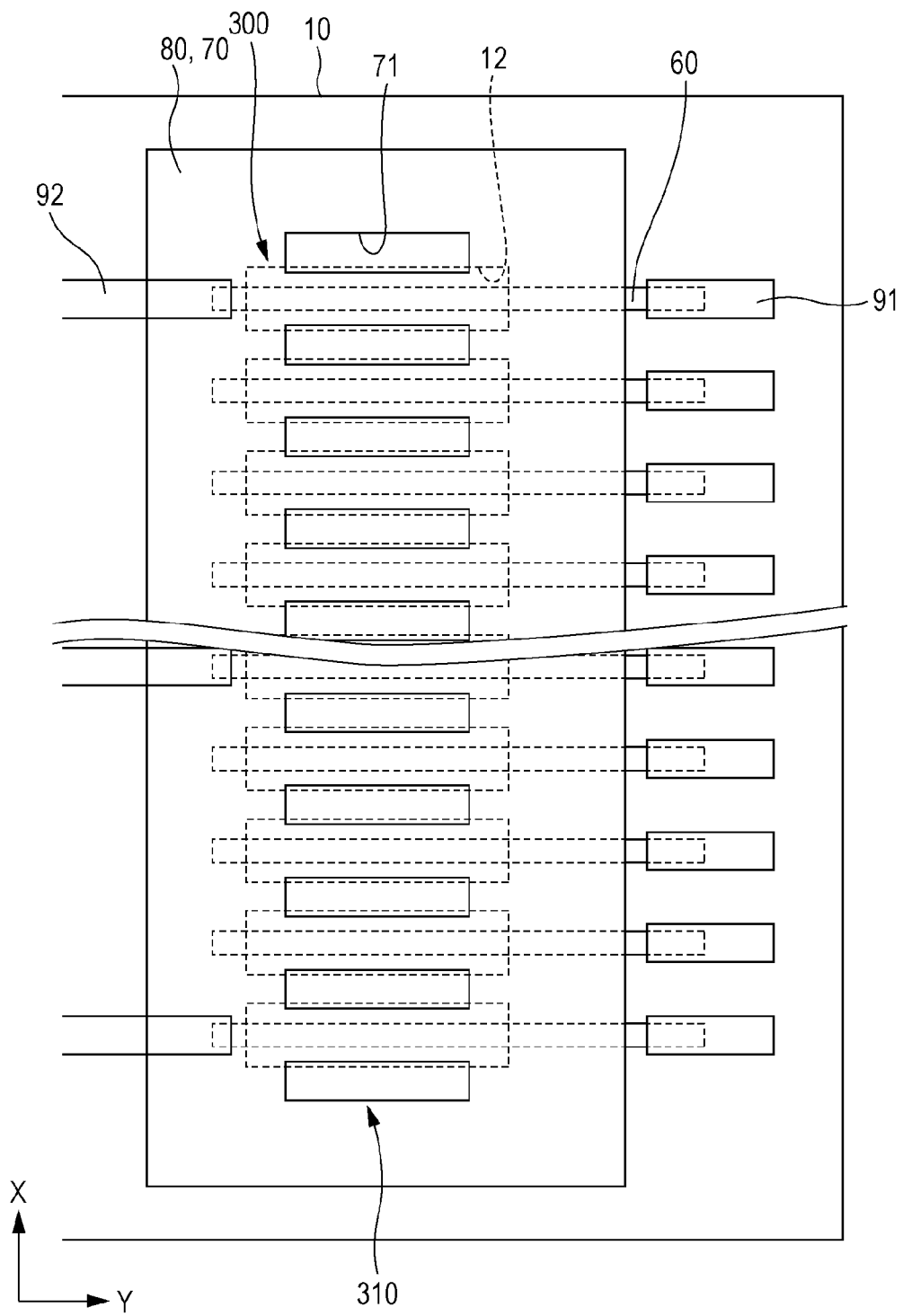
FIG. 5 is a plan view of a main portion of a channel formation substrate.

FIG. 1 is an exploded perspective view of the head according to the embodiment, FIG. 2 is a plan view of the head (a plan view of a liquid ejection surface 20a), FIG. 3 is a sectional view taken along line III-III in FIG. 2, FIG. 4 is a sectional view obtained by enlarging a main portion of FIG. 3, and FIG. 5 is a plan view of a main portion of a channel formation substrate.

In the embodiment, the head 1 is provided with a plurality of members such as a channel formation substrate 10, a communicating plate 15, a nozzle plate 20, a driving circuit board 30, and a compliance board 45.

The channel formation substrate 10 can be formed of, for example, metal such as a stainless steel or Ni, a ceramic material such as $ZrO_2$ or $Al_2O_3$, a glass ceramic material, and an oxide such as an oxide MgO and $LaAlO_3$. In the embodiment, the channel formation substrate 10 is formed of a silicon single crystal substrate. By performing anisotropic etching to the channel formation substrate 10 from one surface side, pressure generating chambers 12 which are partitioned off by a plurality of partition walls are arranged along a direction in which a plurality of nozzle openings 21 which discharge ink are arranged. Hereinafter, the aforementioned direction is referred to as a juxtaposing direction of the pressure generating chambers 12, or a first direction X. In addition, on the channel formation substrate 10, a plurality of rows of the pressure generating chambers 12 are arranged in the first direction X, and two rows are provided in the embodiment. Hereinafter, a row direction in which a plurality of rows of the pressure generating chambers 12 are formed along the first direction X is referred to as a second direction Y. In addition, a direction intersecting with the first direction X and the second direction Y is referred to as a third direction Z in the embodiment. Coordinate axes shown in each of the drawings respectively represent the first direction X, the second direction Y, and the third direction Z, and the direction toward an arrow is referred to as a positive (+) direction, and an opposite direction is referred to as a negative (−) direction. Note that, the directions (X, Y, and Z)

are set to be orthogonal to each other in the embodiment; however, components are not limited to be orthogonally disposed.

On the channel formation substrate 10, for example, a supply path which is smaller than an opening area of the pressure generating chamber 12 and applies a channel resistance to ink flowing into the pressure generating chamber 12 may be provided at one end portion of the pressure generating chamber 12 in the second direction Y.

On one surface side of the channel formation substrate 10 (the side opposite to the driving circuit board 30 (−Z direction)), the communicating plate 15 and the nozzle plate 20 are sequentially laminated. That is, the communicating plate 15 is provided on the one surface of the channel formation substrate 10, and a nozzle plate 20 having nozzle openings 21 is provided on the surface side opposite to side of the channel formation substrate 10 on which the communicating plate 15 is provided.

The communicating plate 15 is provided with a nozzle communicating path 16 through which the pressure generating chamber 12 and the nozzle opening 21 communicate with each other. The communicating plate 15 has a larger area than the channel formation substrate 10, and the nozzle plate 20 has a smaller area than the channel formation substrate 10. With such a communicating plate 15 being provided, the nozzle opening 21 of the nozzle plate 20 and the pressure generating chamber 12 can be separated from each other, and thus the ink in the pressure generating chamber 12 is less likely to be susceptible of thickening due to evaporation of water in the ink occurring in the vicinity of the nozzle opening 21. In addition, the nozzle plate 20 may only cover openings in the nozzle communicating path 16 through which the pressure generating chamber 12 and the nozzle opening 21 communicate with each other, and thus it is possible to relatively reduce the area of the nozzle plate 20, and thereby to realize the cost reduction. In addition, in the embodiment, a surface from which is an ink droplet is discharged by opening the nozzle opening 21 of the nozzle plate 20 is referred to as a liquid ejection surface 20a.

In addition, the communicating plate 15 is provided with a first manifold portion 17 and a second manifold portion 18 which form a portion of a manifold 100.

The first manifold portion 17 is provided by passing through the communicating plate 15 in a thickness direction (a direction in which the communicating plate 15 and the channel formation substrate 10 are laminated). The second manifold portion 18 is provided by being opened to the nozzle plate 20 side of the communicating plate 15 without passing through the communicating plate 15 in the thickness direction.

In addition, on the communicating plate 15, a supply communicating path 19 which communicates with one end portion of the pressure generating chamber 12 in the second direction Y is independently provided for each pressure generating chamber 12. The second manifold portion 18 and the pressure generating chamber 12 communicate with each other through the supply communicating path 19.

Such a communicating plate 15 can be formed of metal such as a stainless steel or Ni, or ceramics such as zirconium. In addition, the communicating plate 15 is preferably formed of a material having the same linear expansion coefficient as that of the channel formation substrate 10. That is, in a case where a material having a different linear expansion coefficient different from that of the channel formation substrate 10 is used as the communicating plate 15, when heating and cooling the communicating plate 15, a warpage is likely to occur on the communicating plate 15 due to a difference of the linear expansion coefficient between the channel formation substrate 10 and the communicating plate 15. In the embodiment, it is possible to suppress the occurrence of warpage by being heated and cooled, cracks due to heat, or peeling by using a material which is the same as that of the channel formation substrate 10, that is, a silicon single crystal substrate, as the communicating plate 15.

The nozzle opening 21 which communicates with each of the pressure generating chambers 12 through the nozzle communicating path 16 is formed on the nozzle plate 20. Such nozzle openings 21 are arranged in the first direction X, and two rows of the nozzle openings 21, each of which is formed of the nozzle openings 21 arranged in the first direction X, are formed in the second direction Y.

As such a nozzle plate 20, it is possible to use, for example, metal such as a stainless steel (SUS), an organic material such as a polyimide resin, and a silicon single crystal substrate. In addition, when using the silicon single crystal substrate as the nozzle plate 20, the linear expansion coefficient between the nozzle plate 20 and the communicating plate 15 is the same, and thus it is possible to suppress the occurrence of the warpage by being heated and cooled, cracks due to heat, or peeling.

On the other hand, a vibrating plate 50 is formed on the surface side (the driving circuit board 30 side (+Z direction)) opposite to side of the channel formation substrate 10 on which the communicating plate 15 is provided. In the embodiment, as the vibrating plate 50, an elastic film 51 which is provided on the channel formation substrate 10 side and is formed of a silicon oxide, and an insulator film 52 which is provided on the elastic film 51, and is formed of a zirconium oxide. In addition, a liquid flow path such as the pressure generating chamber 12 is formed by performing the anisotropic etching on the channel formation substrate 10 from one surface side (from the surface to which the nozzle plate 20 is bonded) of the liquid flow path, and the other surface of the liquid flow path such as the pressure generating chamber 12 is partitioned by the elastic film 51. Needless to say, the vibrating plate 50 is not particularly limited to this configuration, for example, the vibrating plate 50 may be formed by providing any one of the elastic film 51 and the insulator film 52, or may be formed by provided other films.

A piezoelectric actuator 300 which is a piezo element of the embodiment is provided on the vibrating plate 50 of the channel formation substrate 10.

As described above, on the channel formation substrate 10, the plurality of the pressure generating chambers 12 are arranged along the first direction X, and the two rows of the pressure generating chambers 12 are arranged along the second direction Y. The piezoelectric actuators 300 are arranged in the first direction X and form a piezoelectric actuator row 310, and two piezoelectric actuator rows 310 are arranged in the second direction Y. Meanwhile, the piezoelectric actuator row 310 is an example of a piezo element row described in aspects.

The piezoelectric actuator 300 includes a first electrode 60, a piezoelectric layer 70, and a second electrode 80 which are sequentially laminated from the vibrating plate 50 side. The first electrodes 60 which form the piezoelectric actuator 300 are cut and divided for each pressure generating chamber 12 so as to form an individual electrode for each piezoelectric actuator 300. The first electrode 60 is cut and divided for each pressure generating chamber 12 so as to form the individual electrode for each active portion which is a substantial driving portion of the piezoelectric actuator 300. Such a first electrode 60 is formed with a smaller width than the pressure generating chamber 12 in the first direction X of the pressure generating chamber 12. That is, in the first direction X of the pressure generating chamber 12, an end portion of the first electrode 60 is positioned on the inner side of an area facing the pressure generating chamber 12. In addition, in the second direction Y of the pressure generating chamber 12, each of both end portions of the first electrode 60 is extended to the outside of the pressure generating chamber 12. A material of such a first electrode 60 is not limited as long as it is a metallic material, and for example, platinum (Pt) and iridium (Ir) are preferably used.

The piezoelectric layer 70 is continuously provided in the first direction X such that the second direction Y becomes a predetermined width. The width of the piezoelectric layer 70 in the second direction Y is larger than the width of the pressure generating chamber 12 in the second direction Y. For this reason, in the second direction Y of the pressure generating chamber 12, the piezoelectric layer 70 is extended to the outside of the pressure generating chamber 12.

An end portion of the piezoelectric layer 70 on one end portion side (the side opposite to the manifold 100) of the pressure generating chamber 12 in the second direction Y is positioned on the outside from the end portion of the first electrode 60. That is, the end portion of the first electrode 60 is covered with the piezoelectric layer 70. In addition, an end portion of the piezoelectric layer 70 on the other end side of the pressure generating chamber 12 in the second direction Y which is the manifold 100 side is positioned on the inner side from the end portion of the first electrode 60 (the pressure generating chamber 12 side), and the end portion of the first electrode 60 on the manifold 100 side is not covered with the piezoelectric layer 70.

The piezoelectric layer 70 is formed of a piezoelectric material such as an oxide having a polarization structure which is formed on the first electrode 60, and can be formed of, for example, a perovskite type oxide expressed by a general formula of $ABO_3$. As the perovskite type oxide used for the piezoelectric layer 70, for example, a lead based piezoelectric material including lead or a non-lead based piezoelectric material which does not include the lead can be used.

Such a piezoelectric layer 70 is provided with a recessed portion 71 corresponding to each partition wall between the pressure generating chambers 12. The width of the recessed portion 71 in the first direction X is substantially the same as or larger than the width of each partition wall in the first direction. With this, rigidity of a portion (a so-called arm portion of the vibrating plate 50) corresponding to the end portion of the pressure generating chamber 12 in the second direction Y of the vibrating plate 50 is suppressed, and thus the piezoelectric actuator 300 can be favorably displaced.

The second electrode 80 is provided on the surface opposite to the surface of the piezoelectric layer 70 on which the first electrode 60 is provided, and forms a common electrode which is common to a plurality of the active portions. In addition, the second electrode 80 may be or may be not formed on the inner surface of the recessed portion 71, that is, on the side surface of the recessed portion 71 of the piezoelectric layer 70.

The piezoelectric actuator 300 which is formed of the first electrode 60, the piezoelectric layer 70, and the second electrode 80 is displaced by applying a voltage between the first electrode 60 and the second electrode 80. That is, when the voltage is applied between both electrodes, piezoelectric strain occurs in the piezoelectric layer 70 which is pinched between the first electrode 60 and the second electrode 80. In addition, at the time of applying the voltage to both electrodes, a portion of the piezoelectric layer 70 in which the piezoelectric strain occurs is referred to as an active portion. In contrast, a portion of the piezoelectric layer 70 in which the piezoelectric strain does not occur is referred to as a non-active portion.

As described, in the piezoelectric actuator 300, the first electrode 60 is independently provided for each of the plurality of the piezoelectric actuators 300 so as to be an individual electrode, and the second electrode 80 is continuously provided throughout the piezoelectric actuator 300 so as to be a common electrode. Needless to say, the piezoelectric actuator 300 is not limited to the such a configuration, for example, the first electrode 60 may be continuously provided throughout the piezoelectric actuator 300 so as to be a common electrode, and the second electrode may be independently provided for each of the plurality of the piezoelectric actuators 300 so as to be an individual electrode. In addition, for the vibrating plate 50, only the first electrode 60 may serve as a vibrating plate without providing the elastic film 51 and the insulator film 52. In addition, the piezoelectric actuator 300 may substantially serve as vibrating plate.

The actuator substrate described in aspects is provided with the described channel formation substrate 10, the vibrating plate 50, and two piezoelectric actuator rows 310 in the embodiment.

As illustrated in FIGS. 3, 4, and 5, an individual wiring 91 which is a lead-out wiring is drawn out from the first electrode 60 of the piezoelectric actuator 300. In the embodiment, two rows of the piezoelectric actuators 300 (the active portion), each of which is formed of the piezoelectric actuators 300 arranged in the first direction X are provided in the second direction Y. The individual wiring 91 is drawn from each row of the piezoelectric actuators 300 to the outside of the row in the second direction Y.

In addition, a common wiring 92 which is the lead-out wiring is drawn out from the second electrode 80 of the piezoelectric actuator 300. In the embodiment, the common wiring 92 is electrically connected to the second electrode 80 in each of the two rows of the piezoelectric actuators 300. In addition, one common wiring 92 is provided with respect to the plurality of active portions.

Figure 6:
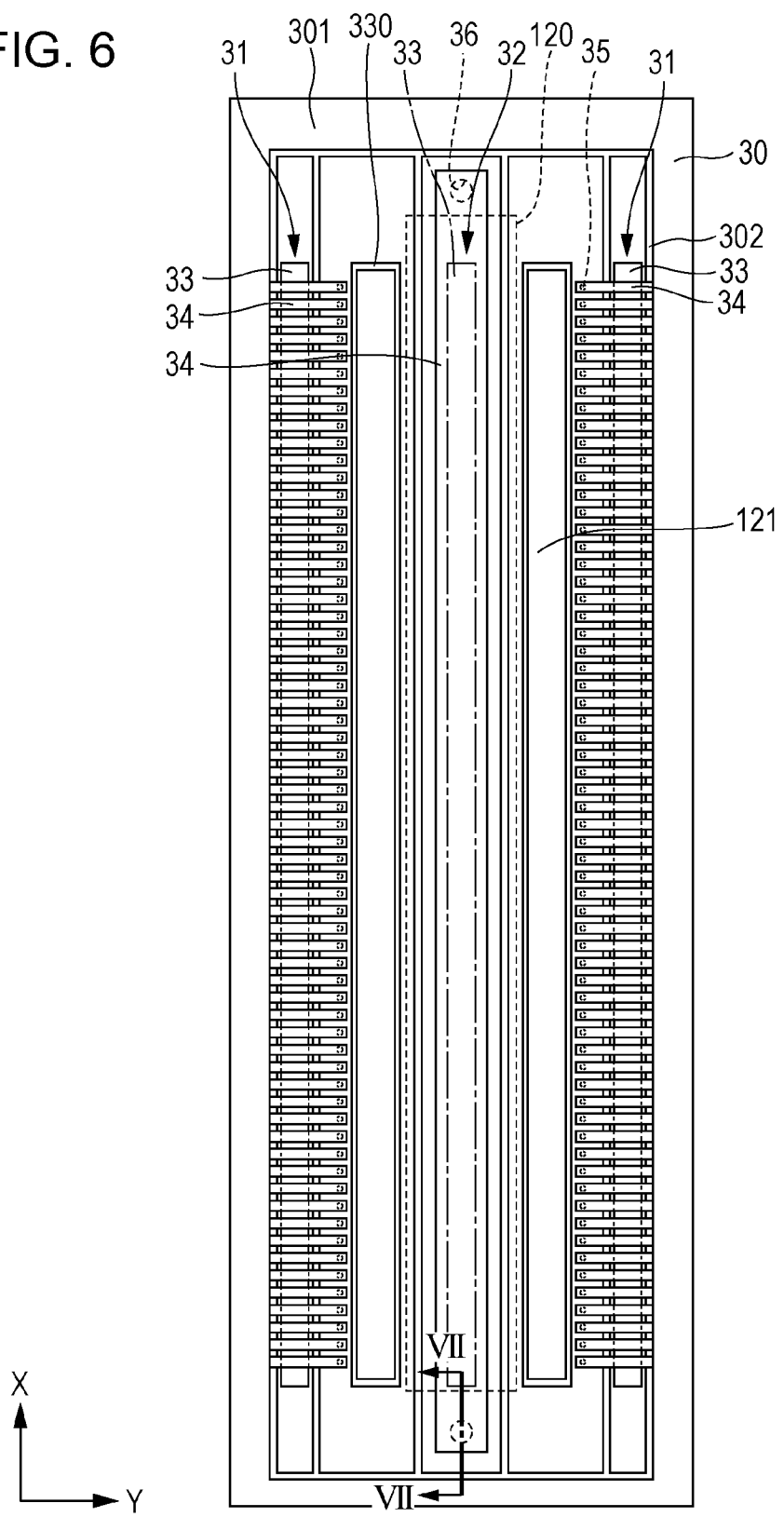
FIG. 6 is a plan view of a driving circuit board in a planar view from the channel formation substrate.
Figure 7:
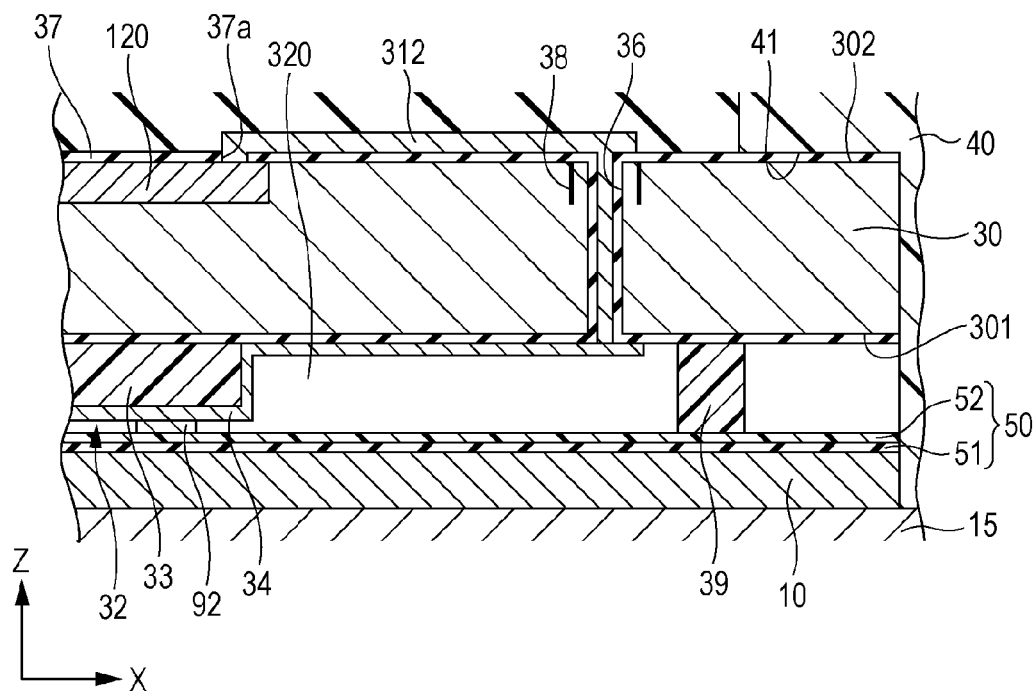
FIG. 7 is a sectional view taken along line VII-VII in FIG. 6.

A driving circuit board 30 having substantially the same size as that of the channel formation substrate 10 is bonded onto the surface of the channel formation substrate 10 on the piezoelectric actuator 300 side. The driving circuit board 30 will be described with reference to FIG. 3 to FIG. 7. FIG. 6 is a plan view in a planar view of a driving circuit board from a channel formation substrate, and FIG. 7 is a sectional view taken along line VII-VII in FIG. 6.

The driving circuit board 30 is a semiconductor substrate which is provided with a driving circuit 120 for driving the piezoelectric actuator 300 on the surface opposite to the channel formation substrate 10. A surface of the driving circuit board 30 which faces the channel formation substrate 10 is set to be a first main surface 301, and a surface of the driving circuit board 30 which is opposite to the channel formation substrate 10 is set to a second main surface 302.

In the embodiment, the driving circuit 120 which is an integrated circuit is formed on the second main surface 302 of the semiconductor substrate through a semiconductor manufacturing process, and is set to be the driving circuit board 30. Needless to say, the driving circuit board is not limited to such a configuration, for example, a driving circuit which is separately formed may be provided on the semiconductor substrate so as to be the driving circuit board.

In addition, the driving circuit 120 according to the embodiment is a circuit which can form a driving signal for driving the piezoelectric actuator 300 and transfer the driving signal to the piezoelectric actuator 300, but is not limited to such a configuration. The driving circuit 120 may be an active circuit for forming such as driving signal, or may be a circuit formed of only the wiring which is used to transfer the driving signal transferred from an external control device to the piezoelectric actuator 300.

As the driving circuit board 30, it is preferable to use a material having substantially the same coefficient of thermal expansion as that of the channel formation substrate 10, for example, glass, and a ceramic material, and in the embodiment, the driving circuit board 30 is formed by using the silicon single crystal substrate, which is the same material as that of the channel formation substrate 10.

In addition, an insulating film 37 is provided on the first main surface 301 and the second main surface 302 of the driving circuit board 30. In the embodiment, an accommodating portion 330 which is recessed in the third direction Z is provided on the first main surface 301 of the driving circuit board 30. As will be described in detail later, an auxiliary wiring 121 which is connected to the driving circuit 120 is provided in the accommodating portion 330. The insulating film 37 covers the second main surface 302 except for the accommodating portion 330.

In addition, a contact hole 37a to which a terminal of the driving circuit 120 is exposed, and in which a first connection wiring 311 and a second connection wiring 312 (described below) are provided are provided on the second main surface 302. The insulating film 37 covers the second main surface 302 except for the contact hole 37a. In addition, as will be described below, the driving circuit board 30 is provided with a first through hole 35 and a second through hole 36; however, the insulating film 37 covers the first through hole 35 and the second through hole 36 continuously from the second main surface 302.

The insulating film 37 is not particularly limited as long as it is a material having insulating properties; for example, it is possible to use a silicon dioxide, a silicon nitride, and the like.

a first bump 31 and a second bump 32 are provided on the first main surface 301 of the driving circuit board 30. In the embodiment, the first bump 31 and the second bump 32 are provided on the insulating film 37 covering the first main surface 301. The first bump 31 and the second bump 32 become a contact point of the individual wiring 91 and the common wiring 92 of the channel formation substrate 10.

The first bump 31 and the second bump 32 is provided with, for example, a core portion 33 which is formed of a resin material having elastic properties, and a metallic film 34 which is formed on the surface of the core portion 33.

The core portion 33 is formed of a photosensitive insulating resin or a thermosetting insulating resin such as a polyimide resin, an acrylic resin, a phenol resin, a silicone resin, a silicone-modified polyimide resin, and an epoxy resin.

In addition, the core portion 33 is formed into a substantially semispherical shape before the driving circuit board 30 and the channel formation substrate 10 are bonded to each other. Here, the semispherical shape means a columnar shape of which an inner surface (a bottom surface) coming in contact with the driving circuit board 30 is a flat surface and an outer surface side which is a non-contact surface is a curved surface. Specifically, the substantially semispherical shape includes a case where a cross-section is formed into a substantially semicircle shape, a substantially semielliptical shape, or a substantially trapezoid shape.

In addition, when the core portion 33 is compressed such that the driving circuit board 30 and the channel formation substrate 10 are relatively close to be each other, a distal end shape thereof is elastically deformed as the surface shape of the individual wiring 91 and the common wiring 92.

With this, even though the warpage and undulation occur on the driving circuit board 30 or the channel formation substrate 10, the core portion 33 is deformed in accordance with the warpage and undulation, and the first bump 31 and the second bump 32, and the individual wiring 91 and the common wiring 92 can be surely connected to each other.

In the embodiment, the core portion 33 is continuously disposed in a linear manner in the first direction X. In addition, total of three core portions 33 are provided in such a manner that two core portions 33 are provided on the outside of two piezoelectric actuator rows 310, and one core portion 33 is provided between two piezoelectric actuator rows 310 in the second direction Y. Further, each of the core portions 33 which are provided on the outside of the two piezoelectric actuator rows 310 forms the first bump 31 connected to the individual wiring 91 of the piezoelectric actuator row 310, and the core portion 33 which is provided between two piezoelectric actuator rows 310 forms the second bump 32 connected to the common wiring 92 of the two piezoelectric actuator rows 310.

Such a core portion 33 can be formed by using photolithography technique and etching technique.

The metallic film 34 covers the surface of the core portion 33. The metallic film 34 is formed of metal, for example, Au, TiW, Cu, Cr (chrome), Ni, Ti, W, NiV, Al, Pd (palladium), and a lead-free solder, or an array, and these may be a single layer or a multiple layer. In addition, the metallic film 34 is deformed as the surface shape of the individual wiring 91 and the common wiring 92 due to the elastically deformed core portion 33, and is metallically bonded to the individual wiring 91 and the common wiring 92.

The metallic film 34 which is connected to the individual wiring 91 is disposed with the same pitch as that of the individual wiring 91 on the surface of the core portion 33 in the first direction X. In addition, the metallic film 34 which is connected to the common wiring 92 is extended so as to cover the entire surface of the core portion 33 in the first direction X. A plurality of the common wirings 92 are formed in the embodiment; the metallic film 34 is formed so as to commonly come in contact with all the plurality of the common wirings 92.

The metallic film 34 which is provided on the surface of the core portion 33 which forms the first bump 31 and the second bump 32 and the individual wiring 91 and the common wiring 92 are bonded to each other at a normal temperature. Specifically, when the driving circuit board 30 and the channel formation substrate 10 in the embodiment are bonded to each other via an adhesive layer 39, the first bump 31 and the second bump 32, and the individual wiring 91 and the common wiring 92 are fixed to each other while coming in contact with each other.

Here, the adhesive layer 39 is formed of, for example, an adhesive such as an epoxy resin, an acrylic resin, and a silicone resin. Particularly, it is possible to easily form the adhesive layer with high accuracy by using a photosensitive resin to be used in such as a photoresist.

In the embodiment, the adhesive layer 39 is provided on both sides of the first bump 31 and both sides of the second bump 32, that is, both sides of each of the first bump 31 and the second bump 32 interposed therebetween in the second direction Y. Since three bumps including the first bumps 31 and the second bump 32 which are extended in the first direction X are provided in such a manner that two first bumps 31 and one second bump 32 are provided in the second direction Y, the adhesive layer 39 which is extended in the first direction X is provided in such a manner that six adhesive layers 39 are provided in the second direction Y. In addition, the adhesive layers 39 which are arranged in the second direction Y are provided such that both end portions are connected to each other in the first direction X. That is, the adhesive layer 39 is formed into a rectangular frame shape so as to surround each row of the piezoelectric actuator rows 310 in a planar view.

As described above, a holding portion 320 which is a space in which the piezoelectric actuator 300 is disposed is formed between the channel formation substrate 10 and the driving circuit board 30 by the adhesive layer 39 bonding the channel formation substrate 10 and the driving circuit board 30. In the embodiment, the adhesive layer 39 is continuously provided to cover around each row of the piezoelectric actuator rows 310, and thus the holding portion 320 corresponding to each piezoelectric actuator row 310 is independently provided between the channel formation substrate 10 and the driving circuit board 30.

Meanwhile, the holding portion 320 may be a sealed space which is blocked to the outside or, a non-sealed space of which a portion communicating with the outside.

The driving circuit board 30 is provided with the first through hole 35 and the second through hole 36 which communicate with the first main surface 301 and the second main surface. In the embodiment, the first through hole 35 and the second through hole 36 are a linear through-hole along the driving circuit board 30 in the third direction Z. However, the configuration thereof is not limited, and for example, the first through hole 35 and the second through hole 36 may be obliquely provided with respect to the third direction Z.

A plurality of the first through holes 35 are provided for each the first electrode 60 which is the individual electrode. As described above, two rows of the first electrodes 60 each of which is formed of the plurality of first electrodes 60 in the first direction X are provided in the second direction Y. Two rows of the first through holes 35, each of which is formed of the first through holes 35 provided in a first direction X are provided in the second direction Y corresponding to the first electrode 60.

At least one of second through holes 36 which are provided corresponding to the second electrode 80 which is the common electrode is provided. In the embodiment, in a planar view of the driving circuit board 30, two second through holes 36 are provided on the outside further than the second bump 32 in the first direction X.

The first connection wiring 311 and the second connection wiring 312 are formed in the first through hole 35 and the second through hole 36. The first through hole 35 and the second through hole 36 are filled with the first connection wiring 311 and the second connection wiring 312. In addition, one end of the first connection wiring 311 and the second connection wiring 312 is connected to a terminal of the driving circuit 120 on the second main surface 302 of the driving circuit board 30. That is, the first connection wiring 311 and the second connection wiring 312 are connected to the terminal of the driving circuit 120 while continuously extending onto the second main surface 302 (the insulating film 37) from the first through hole 35 and the second through hole 36, and further extending into the contact hole 37a.

In addition, the metallic film 34 of the first bump 31 and the second bump 32 is extended to the center of the first main surface 301 of the driving circuit board 30 in the second direction Y. The other end of the first connection wiring 311 and the second connection wiring 312 is connected to a portion to which the metallic film 34 of the first bump 31 and the second bump 32 is extended, on the first main surface 301 side of the driving circuit board 30. That is, the first bump 31 and the second bump 32 is electrically connected to the driving circuit 120 by the first connection wiring 311 and the second connection wiring 312.

The first connection wiring 311, the second connection wiring 312, and the driving circuit 120 are provided with protective films 340 for protecting the first connection wiring 311, the second connection wiring 312, and the driving circuit 120. In the embodiment, a protective film 340 is provided so as to protect the driving circuit 120 from water, and has properties which are less likely to be changed with respect to moisture (water), and are less likely to transmit (permeate moisture) the moisture (water).

The protective film 340 is not particularly limited as long as the material has a moisture-resistant. For example, an inorganic insulating material such as a silicon nitride (SiN), a silicon oxide (SiOx), a tantalum oxide (TaOx), and an aluminum oxide (AlOx), and a material such as polyimide (PI), polyvinylidene fluoride (PVdF), and a fluorine-based resin. In addition, the protective film 340 may be a single layer, or may be a plurality of layers. In this case, the plurality of protective films 340 may be formed of the same material, or the plurality of protective films 340 may be formed of different materials from each other.

As will be described in detail later, the first connection wiring 311 and the second connection wiring 312 can be formed through plating. The first connection wiring 311 and the second connection wiring 312 are formed through the plating such that the first through hole 35 and the second through hole 36 which are fine opening can be filled with the first connection wiring 311 and the second connection wiring 312.

Meanwhile, the first connection wiring 311 and the second connection wiring 312 are not limited to the aspect that the first through hole 35 and the second through hole 36 are filled with the first connection wiring 311 and the second connection wiring 312. For example, the metallic film which is formed by using a gas phase method such as a sputtering method only on the inner surface of the first through hole 35 and the second through hole 36 may be the first connection wiring 311 and the second connection wiring 312.

The first connection wiring 311 and the second connection wiring 312 connected to the first electrode 60 and the second electrode 80 via the first bump 31 and the second bump 32. Specifically, the individual wiring 91 which is connected to the first electrode 60 and the first connection wiring 311 are electrically connected to each other via the first bump 31. In addition, the common wiring 92 which is connected to the second electrode 80 and the second connection wiring 312 are electrically connected to each other via the second bump 32.

In addition, the first connection wiring 311 and the second connection wiring 312 may be directly connected to the first electrode 60 and the second electrode 80 without the individual wiring 91 and the common wiring 92 interposed therebetween.

As described above, in the head 1 according to the embodiment, the piezoelectric actuator 300 is accommodated in the holding portion 320, and the driving circuit 120 which is provided on the second main surface 302 side of the driving circuit board 30. The driving circuit 120 is disposed on the side opposite to the piezoelectric actuator 300 (a so-called face down disposition). In addition, these piezoelectric actuator 300 and the driving circuit 120 are electrically connected to each other via the first connection wiring 311 and the second connection wiring 312 which pass through the driving circuit board 30 and extend in the third direction Z.

If the driving circuit 120 is face-down disposed, as described in the related art, on the first main surface 301 side of the driving circuit board 30, the input portion which is connected to the wiring from the external control circuit is required to be provided on the outside further than the holding portion 320. That is, the driving circuit board 30 is enlarged on a horizontal surface (a surface defined by the first direction X and the second direction Y).

However, in the head 1 of the embodiment, when the driving circuit 120 is face-up disposed, the driving circuit 120 does not require an area in which the input portion connected to the external wiring from the external control circuit is provided. Accordingly, the area for forming such an input portion is not required to be provided in the driving circuit board 30, and thus it is possible to realize reduction of the driving circuit board 30 in size.

In addition, in the head 1 according to the embodiment, the first connection wiring 311 and the second connection wiring 312 are extended in the third direction Z passing through the driving circuit board 30. With this, even when the piezoelectric actuator 300 and the driving circuit 120 are separated from each other in and out of the holding portion 320 by face-up disposing the driving circuit 120, the piezoelectric actuator 300 and the driving circuit 120 can be electrically connected to each other.

Here, a connection wiring which connects the piezoelectric actuator 300 and the driving circuit 120 is provided as follows when being provided without passing through the driving circuit board 30. In addition, the individual wiring 91 and the common wiring 92 are extended to the outside of the holding portion 320 in the first direction X and the second direction Y. In addition, the individual wiring 91 and the common wiring 92 which are extended to the outside is connected to the driving circuit 120 by the wiring such as a bonding wiring. In such an aspect, it is required to provide an area in which the individual wiring 91 and the common wiring 92 are extended to the outside of the holding portion 320, and thus the head 1 is enlarged on the horizontal surface (a surface defined by the first direction X and the second direction Y).

However, in the head 1 according to the embodiment, the first connection wiring 311 and the second connection wiring 312 are extended in the third direction Z passing through the driving circuit board 30, and thus it is possible to prevent the head 1 from being enlarged on the horizontal surface.

As described above, the head 1 according to the embodiment can be reduced on the horizontal surface. In addition, the head 1 can be reduced, and thus it is possible to correspond to the nozzle opening 21 with high density, thereby discharging ink with high density.

In addition, in the head 1 according to the embodiment, the holding portion 320 is formed between the channel formation substrate 10 and the driving circuit board 30, and the height thereof is defined by the first bump 31 and the second bump 32. In this way, the first bump 31 and the second bump 32 have a function of electrically connecting the piezoelectric actuator 300 and the driving circuit 120 as described, and also have a function of forming the holding portion 320. Accordingly, it is possible to reduce a cost for providing a component or a portion for defining the height of the holding portion 320.

In addition, the common wiring 92 drawn from the second electrode 80 which is the common electrode is provided between the two piezoelectric actuator rows 310. That is, the second electrodes 80 of the two piezoelectric actuator rows 310 are integrally formed. For this reason, only one second bump 32 is provided so as to be connected to the second electrode 80. As a result, it is possible to reduce the width of the driving circuit board 30 in the second direction Y by providing total of three bumps including two first bumps 31 and one second bump 32.

In a case where the individual wiring 91 which is drawn from the first electrode 60 which is the individual electrode is provided between two piezoelectric actuator rows 310, it is not possible to integrally form each of the individual wirings 91. Accordingly, the two first bumps 31 which correspond to each piezoelectric actuator row 310 are required to be disposed between two piezoelectric actuator rows 310. In addition, the two second bumps 32 which correspond to each of the second electrodes 80 are required to be disposed on the outside of the two piezoelectric actuator rows 310. As a result, there is a need to provide total of four bumps including two first bumps 31 and two second bumps 32, thereby enlarging the width of the driving circuit board 30 in the second direction Y.

In addition, the second bump 32 is provided between two piezoelectric actuator rows 310. That is, the second bump 32 has a length which is the same as or is shorter than the length of the piezoelectric actuator row 310 in the first direction X. With this, it is possible to make the length of the second bump 32 in the first direction X short compared with a case in which the second bump 32 is provided other area instead of being provided between the piezoelectric actuator rows 310, and also it is possible to reduce the driving circuit board 30 on which the second bump 32 is provided in the first direction X.

In addition, in the head 1 according to the embodiment, the adhesive layer 39 is provided on both sides of each of the first bump 31 and the second bump 32 in the second direction Y. With such a configuration, it is possible to more ensurely maintain the electrical connection between the first bump 31 and the second bump 32, and the individual wiring 91 and the common wiring 92.

In addition, as described above, the metallic film 34 forming the second bump 32 is formed so as to be commonly connected to all of the plurality of common wirings 92. Since the second bump 32 is provided with such a metallic film 34, at least any one of the second through hole 36 for connecting the metallic film 34 to the driving circuit 120 and the second connection wiring 312 which is formed in the second through hole 36 may be formed. With this, it is possible to reduce the area in which the second through hole 36 is provided on the driving circuit board 30 to be minimum necessary, thereby realizing reduction of the driving circuit board 30 in size.

In addition, on the driving circuit board 30, the second through hole 36 and the second connection wiring 312 are provided on both sides of the second bump 32 in the first direction X. With this, a distance between each common wiring 92 and the driving circuit 120 is reduced, and thus it is possible to suppress the variation of a voltage drop. For this reason, it is possible to suppress variation of ink discharging properties in the piezoelectric actuator 300.

In this way, it is possible to suppress the variation of the voltage drop as long as the plurality of second through holes 36 and the second connection wirings 312 are provided, but it is required to provide an area for forming the second through holes 36 and second connection wirings 312 on the driving circuit board 30. In the embodiment, two second through holes 36 and two second connection wirings 312 are disposed on both sides of the second bump 32 in the first direction X. That is, the area in which the second through hole 36 and the second connection wiring 312 are provided is limited to the outside further than the second bump 32 in the first direction X. With this, it is possible to suppress the variation of the voltage by the two second through holes 36 and the two second connection wirings 312, and to reduce the driving circuit board 30 in the second direction Y.

In addition, as illustrated in FIG. 4, the adhesive layer 39 which bonds the channel formation substrate 10 and the driving circuit board 30 overlaps with a portion of the first bump 31 in the connection direction of the first bump 31, that is, in the third direction Z. Specifically, the adhesive layer 39 is extended to the extent that the width of the adhesive layer 39 in the second direction Y does not disturb the connection between the first bump 31 and the individual wiring 91 on the channel formation substrate 10 side. That is, in the embodiment, the cross-section, that is, sectional shape of the adhesive layer 39 in the second direction Y is formed into a trapezoid shape in which the channel formation substrate 10 side is wide and the driving circuit board 30 side is narrow. In this way, the adhesive layer 39 and the first bump 31 overlap with each other in the third direction Z, and thus it is possible to improve the bonding strength between the channel formation substrate 10 and the driving circuit board 30 by increasing an adhesive area of the adhesive layer 39. Further, in the embodiment, since the adhesive area of the adhesive layer 39 is extended to the first bump 31 side to the extent that the connection between the first bump 31 and the individual wiring 91 is not disturbed, it is possible to realize the reduction of the adhesive layer 39 in size compared with a case where the adhesive layer 39 is extended to the side opposite to the first bump 31. In addition, although not particularly illustrated, the same is true for the adhesive layer 39 in the common wiring 92, and thus it is possible to further improve the bonding strength between the channel formation substrate 10 and the driving circuit board 30.

In addition, as illustrated in FIG. 4 and FIG. 6, in the head 1 according to the embodiment, the accommodating portion 330 is provided on the first main surface 301 of the driving circuit board 30. The accommodating portion 330 is a portion which is recessed on the first main surface 301 of the driving circuit board 30 in the third direction Z. In the embodiment, on the first main surface 301 of the driving circuit board 30, two accommodating portions 330 are extended along the first direction X on both sides of the second bump 32 in the second direction Y. These accommodating portions 330 are directed to each of the piezoelectric actuator rows 310.

An auxiliary wiring 121 which is connected to the driving circuit 120 is provided in each accommodating portion 330. The auxiliary wiring is an example of the wiring which is formed in the accommodating portion described in aspects. Although not particularly illustrated, the driving circuit board 30 is provided with the through hole passing through the third direction Z, and the through hole is filled with metal such as a conductive member similar to the first connection wiring 311. With this, the auxiliary wiring 121 is electrically connected to the driving circuit 120 via the conductive member in the through hole.

The auxiliary wiring 121 is connected to the wiring having a small amount of current capacity which is included in the driving circuit 120, and thus it is possible to reduce the electric resistance of the wiring. The auxiliary wiring 121 is provided in an area in the holding portion 320 on the first main surface 301 of the driving circuit board 30. The area in which the driving circuit 120 is face-up disposed corresponds to an area in which an electronic component or the like is not particularly formed. The auxiliary wiring 121 is provided by using a vacant space within such a holding portion. In this way, in the driving circuit board 30, an area for providing the auxiliary wiring 121 is not necessary to be separately provided on the outside of the holding portion 320, and thus it is possible to realize the reduction of the head 1 in size.

In addition, by providing the accommodating portion 330, it is possible to widen a distance between an upper surface portion of the piezoelectric actuator row 310 and the first main surface 301 of the driving circuit board 30 in the third direction Z. That is, the auxiliary wiring 121 can be separated from the piezoelectric actuator 300 by disposing the auxiliary wiring 121 in the accommodating portion 330 rather than a case in which the auxiliary wiring 121 is disposed on the first main surface 301. With this, it is possible to reduce a risk that displacement of the piezoelectric actuator 300 is disturbed by the first main surface 301.

Further, there is a risk of discharge due to a potential difference between the auxiliary wiring 121 and the piezoelectric actuator 300, but since the auxiliary wiring 121 is disposed in the accommodating portion 330 and the distance between the auxiliary wiring 121 and the piezoelectric actuator 300 is widened, it is possible to realize a reliable head 1 by protecting the piezoelectric actuator 300 from being destructed due to the discharge.

Meanwhile, there is no need to provide the auxiliary wiring 121 by being connected to the driving circuit 120 so as to reduce the electric resistance; the auxiliary wiring 121 may be used in various uses. For example, the auxiliary wiring 121 may be connected to the second bump 32. With this, the auxiliary wiring 121 is connected to the second electrode 80 which is the common electrode, and thus it is possible to suppress variation in voltages applied to the active portion due to the wiring resistance difference.

In addition, the auxiliary wiring 121 may not be provided in the accommodating portion 330. In this case, it is possible to prevent the displacement of the piezoelectric actuator 300 from disturbing the first main surface 301 of the driving circuit board 30 by providing the accommodating portion 330. In addition, the auxiliary wiring 121 may be provided on the first main surface 301.

Figure 8:
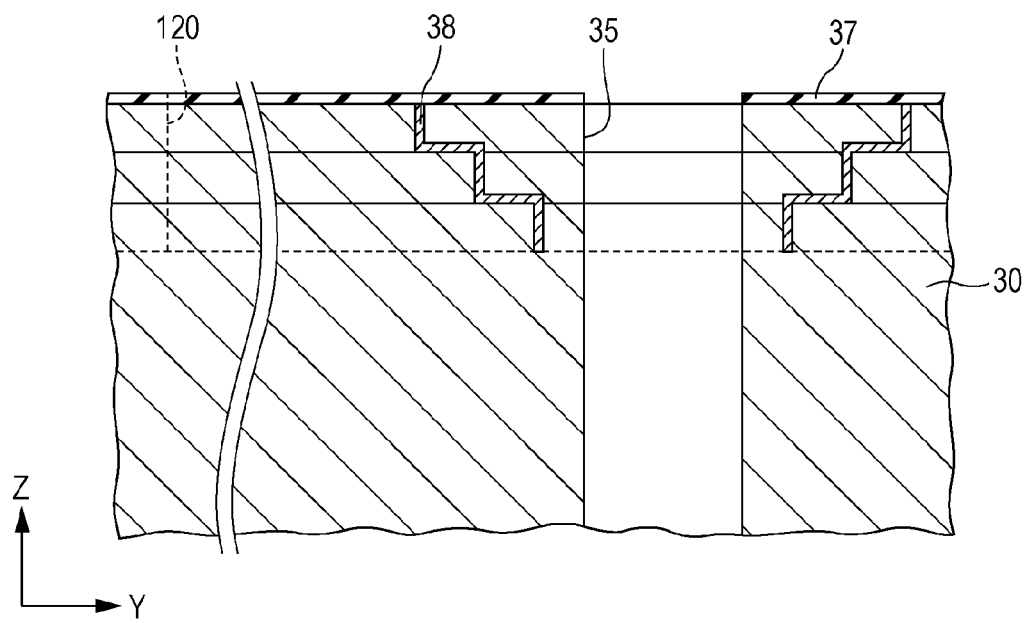
FIG. 8 is a sectional view of the vicinity of a first through hole on a first main surface side of the driving circuit board.

Here, a guard ring which is provided in the vicinity of the first through hole 35 will be described with reference to FIG. 8. FIG. 8 is a sectional view of the vicinity of the first through hole 35 on the first main surface 301 of the driving circuit board 30.

In a case where the first through hole 35 and the second through hole 36 are provided on the driving circuit board 30, water contained in the environment atmosphere enters the driving circuit 120 via the first through hole 35 and the second through hole 36, and thus it is likely to occur malfunction or breakdown of the driving circuit 120 is generated.

In this regards, as illustrated in FIG. 3 and FIG. 8, the metallic wiring 38, a so-called guard ring is provided in the vicinity of the first through hole 35 and the second through hole 36 on the first main surface 301 and the second main surface 302 of the driving circuit board 30. When the metallic wiring 38 is provided in the driving circuit board 30, the moisture contained in the environment atmosphere is prevent form entering the driving circuit 120 via the first through hole 35 and the second through hole 36 so as to suppress the malfunction or breakdown of the driving circuit 120.

In addition, the metallic wiring 38 may be continuously provided along the driving circuit board 30 in the third direction Z which is a thickness direction. Further, the metallic wiring 38 may be provided on only one of the first main surface 301 and the second main surface 302.

As illustrated in FIG. 1 to FIG. 3, a case member 40 which forms the manifold 100 communicating with the plurality of pressure generating chambers 12 is fixed to a bonding body formed of the channel formation substrate 10, the driving circuit board 30, the communicating plate 15, and the nozzle plate 20. The case member 40 is formed into the substantially the same shape as that of the communicating plate 15, and is bonded to the driving circuit board 30 and the aforementioned communicating plate 15. Specifically, the case member 40 includes a recessed portion 41 having a depth for accommodating the channel formation substrate 10 and the driving circuit board 30 on the driving circuit board 30 side. The recessed portion 41 includes an opening area larger than the surface which is bonded to the channel formation substrate 10 of the driving circuit board 30. In addition, in a state where the channel formation substrate 10 and the like are accommodated in the recessed portion 41, the opening surface of the recessed portion 41 on the nozzle plate 20 side is sealed by the communicating plate 15. In addition, the case member 40 is provided with a third manifold portion 42 having a recessed shape on both sides of the recessed portion 41 in the second direction Y. The third manifold portion 42, the first manifold portion 17 provided on the communicating plate 15, and the second manifold portion 18 constitute the manifold 100 of the embodiment.

As a material of the case member 40, for example, a resin or metal can be used. In addition, when a resin material is molded as the case member 40, it can be mass-produced at low cost.

The compliance board 45 is provided on the surface of the communicating plate 15 on the nozzle plate 20 side. The compliance board 45 seals the openings of the first manifold portion 17 and the second manifold portion 18 on the nozzle plate 20 side. Such a compliance board 45 is provided with a sealing film 46 and a fixing substrate 47 in the embodiment. The sealing film 46 is formed of a thin film having flexibility (for example, a thin film having a thickness of 20 μm or less, which is formed of polyphenylene sulfide (PPS), the stainless steel (SUS), or the like), and the fixing substrate 47 is formed of a hard material formed of metal such as the stainless steel (SUS). The area of the fixing substrate 47 which faces the manifold 100 becomes an opening portion 48 which is completely removed in the thickness direction, and thus one surface of the manifold 100 becomes a compliance portion 49 which is a flexible portion sealed by only the sealing film 46 having flexibility.

The case member 40 is provided an induction path 44 which communicates with the manifold 100 so as to supply ink to each of the manifolds 100. In addition, the case member 40 is provided with a connection port 43 to which the driving circuit board 30 is exposed and into which an external wiring (not shown) is inserted, and the external wiring inserted into the connection port 43 is connected to the driving circuit 120.

In the head 1 having such a configuration, at the time of ejecting the ink, the inside of channel from the manifold 100 to the nozzle opening 21 is filled with the ink from a liquid storage portion for storing ink via an induction path 44. Thereafter, in response to a signal from the driving circuit 120, the voltage is applied to each of the piezoelectric actuator 300 corresponding to the pressure generating chamber 12, and thus the piezoelectric actuator 300 and the vibrating plate 50 are deformed to be bent. With this, the pressure in the pressure generating chamber 12 is increased and an ink droplet is ejected from a predetermined nozzle opening 21.

Here, a manufacturing method of the head 1 according to the embodiment will be described with reference to FIG. 9A to FIG. 16B. FIG. 9A to FIG. 16B are sectional views illustrating the manufacturing method of the head according to the embodiment.

Figure 9A:
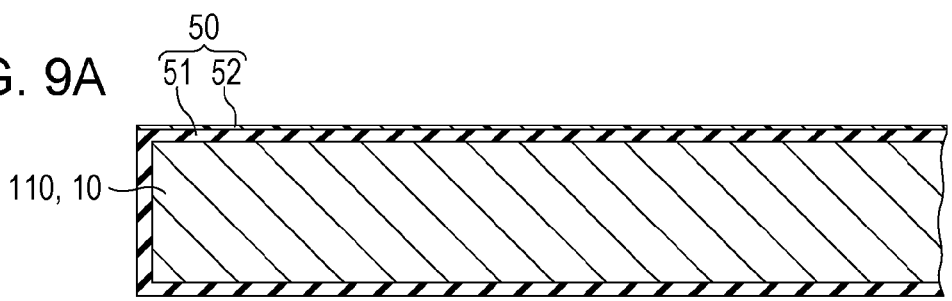
FIGS. 9A to 9E are sectional views illustrating a method of manufacturing the head.

As illustrated in FIG. 9A, the vibrating plate 50 is formed on a top surface of channel formation substrate wafer 110 in which a plurality of channel formation substrates 10 which are silicon wafers are integrally formed. In the embodiment, the vibrating plate 50 is formed by laminating a silicon dioxide (an elastic film 51) formed by thermally oxidizing the channel formation substrate wafer 110, and after forming a film through a sputtering method, and a zirconium oxide (the insulator film 52) obtained through the thermal oxidation.

Figure 9B:
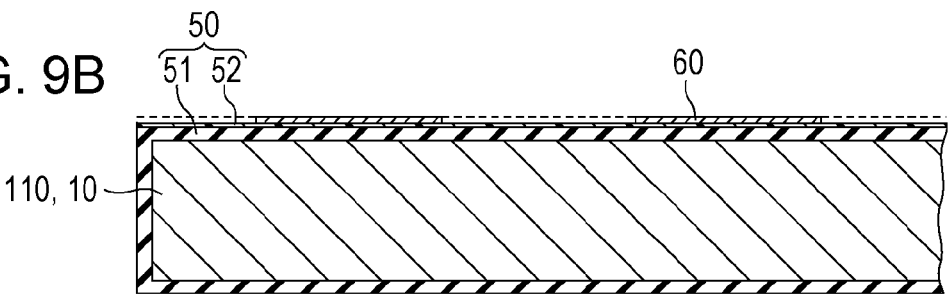

Next, as illustrated in FIG. 9B, the first electrode 60 is formed on the entire surface of the vibrating plate 50 and is patterned in a predetermined shape. Meanwhile, a control layer may be formed in the first electrode 60 so as to control a crystal growth of the piezoelectric layer 70. In the embodiment, although not particularly illustrated, titanium is used for crystal control of the piezoelectric layer 70 (PZT). The titanium is suctioned into the piezoelectric layer 70 when forming a film of the piezoelectric layer 70, and thus does not exist as a film after forming the piezoelectric layer 70.

Figure 9C:
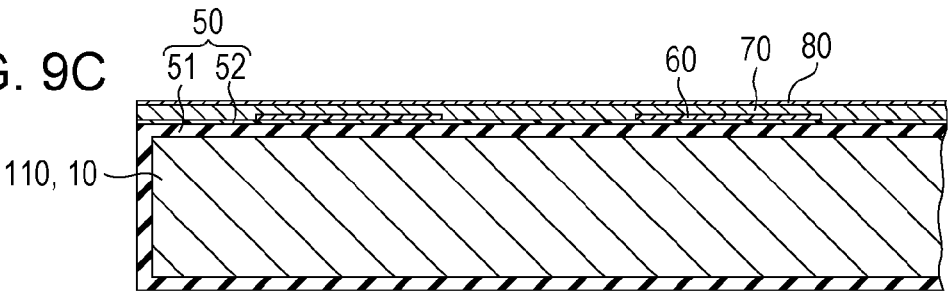

Next, as illustrated in FIG. 9C, the piezoelectric layer 70 and the second electrode 80 are sequentially laminated on the first electrode 60. Here, in the embodiment, a so-called sol obtained by dissolving and dispersing a metal complex in a solvent is coated and dried to be gelled, and further calcined at a high temperature so as to obtain a piezoelectric layer 70 formed of a metal oxide, that is, the piezoelectric layer 70 is formed by using a so-called sol-gel method. In addition, the manufacturing method of the piezoelectric layer 70 is not limited to the sol-gel method, for example, a metal-organic decomposition (MOD) method or a physical vapor deposition (PVD) method such as a sputtering method and a laser ablation may be used. That is, the piezoelectric layer 70 may be formed by using any one of a liquid phase method and a vapor phase method.

Figure 9D:
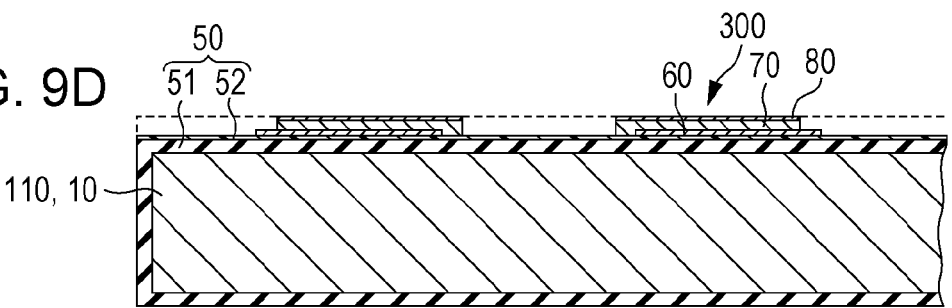

Next, as illustrated in FIG. 9D, the piezoelectric actuator 300 is formed by patterning the piezoelectric layer 70 and the second electrode 80 at the same time. In addition, an example of the patterning of the piezoelectric layer 70 and the second electrode 80 includes dry etching such as reactive ion etching or ion milling.

Figure 9E:
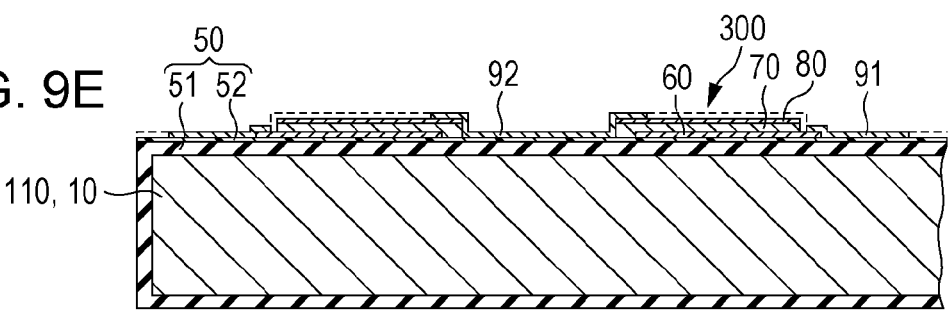

Next, as illustrated in FIG. 9E, the individual wiring 91 and the common wiring 92 which are formed of gold (Au) are formed and patterned in a predetermined shape.

Next, the plurality of driving circuit boards 30 are integrally formed on a wafer for driving circuit board 130 which is a silicon wafer.

Figure 10A:
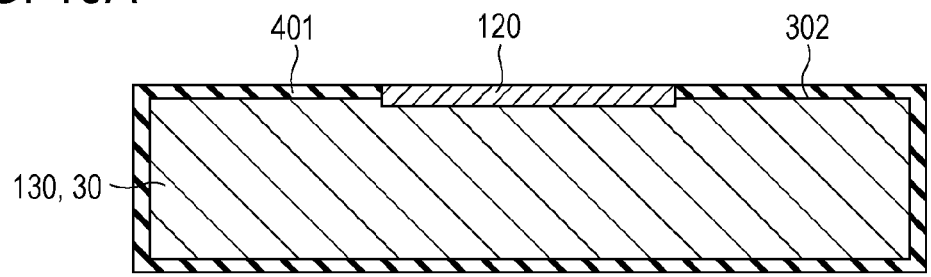
FIGS. 10A to 10C are sectional views illustrating the manufacturing method of the head.

Specifically, as illustrated in FIG. 10A, a first insulating film 401 which is formed of a silicon dioxide is formed by thermally oxidizing the wafer for driving circuit board 130, and the driving circuit 120 is integrally formed one surface (the second main surface 302).

Figure 10B:
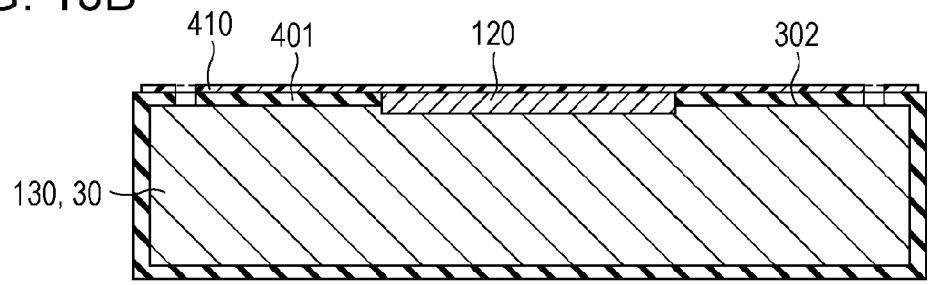

Next, as illustrated in FIG. 10B, a portion corresponding to the first through hole 35 in the first insulating film 401 is removed. Specifically, a resist layer 410 is provided on the second main surface 302 of the wafer for driving circuit board 130, and is exposed to light such that a predetermined-shaped portion of the resist layer 410 corresponding to the first through hole 35 is removed. Although not particularly illustrated, the second through hole 36 is also formed in the same way. In addition, portions corresponding to the first through hole 35 and the second through hole 36 in the first insulating film 401 are removed through the dry etching. Thereafter, remaining resist layer 410 is removed.

Figure 10C:
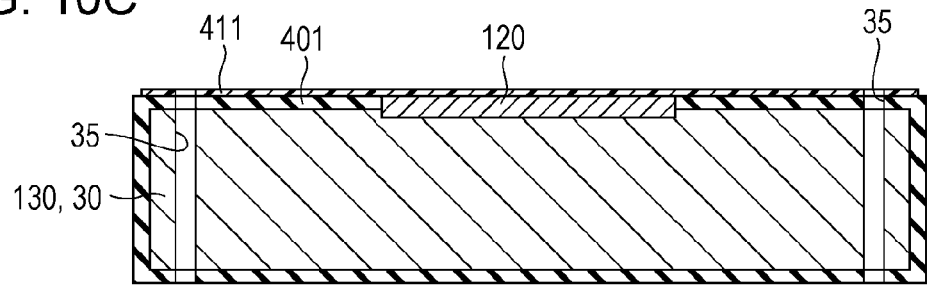

Next, as illustrated in FIG. 10C, a resist layer 411 is provided on the second main surface 302 of the wafer for driving circuit board 130, and is exposed to light such that predetermined-shaped portions corresponding to the first through hole 35 and the second through hole 36 are exposed. In addition, the first through hole 35 and the second through hole 36 are formed on the wafer for driving circuit board 130 by removing silicon through the dry etching. Thereafter, the resist layer 411 is removed.

Figure 11A:
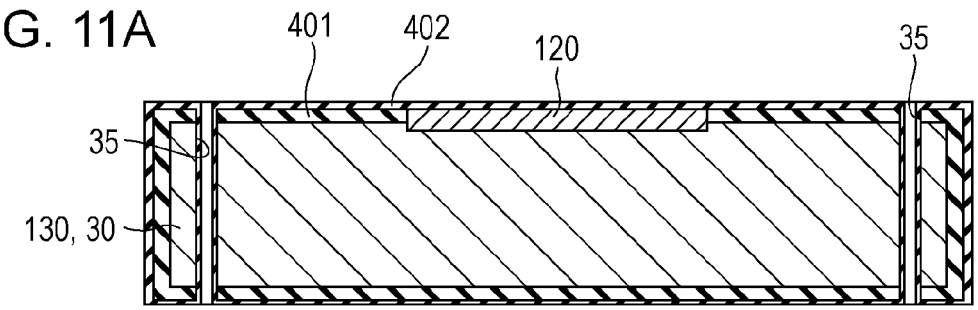
FIGS. 11A to 11C are sectional views illustrating the manufacturing method of the head.

Next, as illustrated in FIG. 11A, a second insulating film 402 is formed on the wafer for driving circuit board 130. Specifically, the second insulating film 402 which is formed of, for example, a silicon dioxide is formed on the entire surface of the wafer for driving circuit board 130 through a CVD method. With this, the inner surface of the first through hole 35 of the wafer for driving circuit board 130 which is a silicon substrate is insulated from the second insulating film 402. Although not particularly illustrated, the inner surface of the second through hole 36 is also insulated from the second insulating film 402.

Figure 11B:
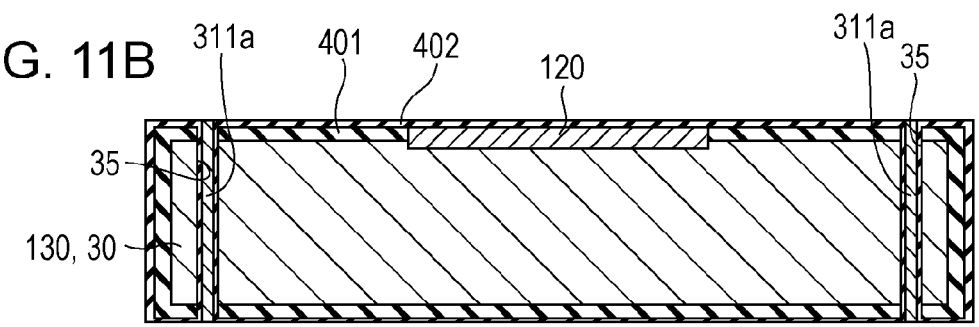

Next, as illustrated in FIG. 11B, the first connection wiring 311a which forms a portion of the first connection wiring 311 is formed in the first through hole 35. Here, the first connection wiring 311 formed of copper is formed.

Specifically, a sheet layer formed of copper is formed in the first through hole 35 through the CVD method and the spattering method. The sheet layer serves as an electroless plating catalyst (an activator). Next, the first connection wiring 311 formed of copper is formed through electroless plating on the sheet layer. With this, a first connection wiring 311a formed of copper with which the first through hole 35 is filled is formed. In addition, although not particularly illustrated, a portion of the second connection wiring 312 formed of copper is also formed in the second through hole 36 in the same way. Thereafter, it is preferable that a CMP process is performed on both surface of the wafer for driving circuit board 130.

Figure 11C:
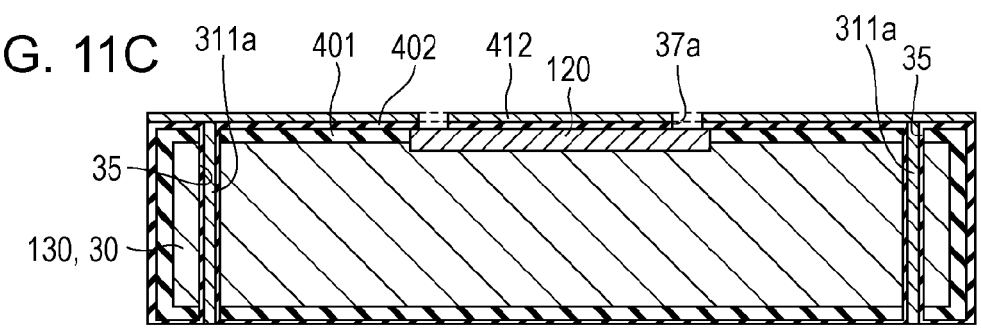

Next, as illustrated in FIG. 11C, a terminal portion of the driving circuit 120 is exposed. Specifically, the resist layer 412 is formed on the second main surface 302 of the wafer for driving circuit board 130, and is exposed to light such that the terminal of the driving circuit 120 is exposed. In addition, the contact hole 37a is formed by removing a portion of the second insulating film 402 on the second main surface 302 through the dry etching so as to expose a terminal of the driving circuit 120. Thereafter, the resist layer 412 is removed.

Figure 12A:
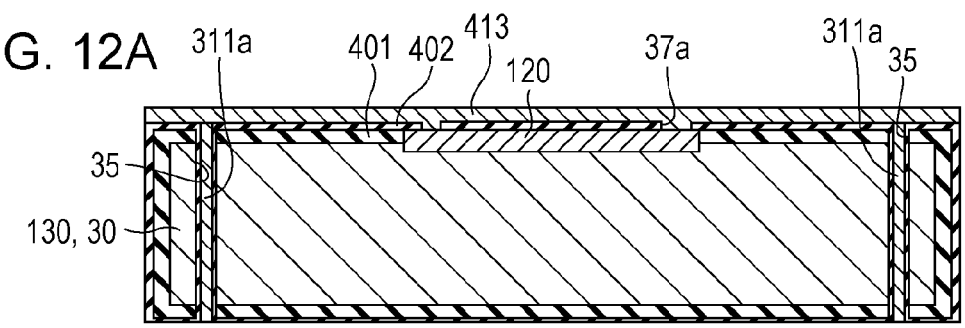
FIGS. 12A to 12C are sectional views illustrating the manufacturing method of the head.

Next, as illustrated in FIG. 12A, a first connection wiring 311b which forms a portion of the first connection wiring 311 is formed on the second main surface 302 of the wafer for driving circuit board 130. Specifically, an adhesion layer (particularly not shown) is formed on the entire surface of the second main surface 302 of the wafer for driving circuit board 130, and a wiring layer 413 formed of gold is formed on the adhesion layer. As the adhesion layer, when using metal and copper for the wiring layer 413, nickel or a nickel-chrome alloy (nichrome), and titanium-tungsten can be used.

Figure 12B:
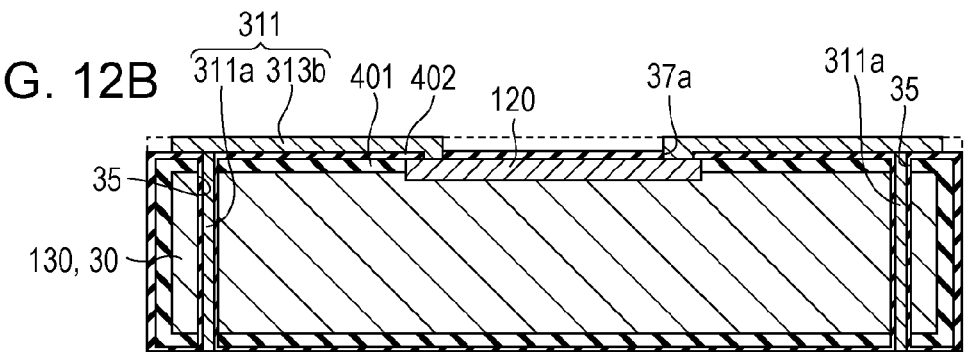

Next, as illustrated in FIG. 12B, the first connection wiring 311 which is formed of the first connection wiring 311a and the first connection wiring 311b is formed by patterning the wiring layer 413. In addition, the patterning of the wiring layer 413 can be performed by forming, for example, a resist in a predetermined shape on the wiring layer 413, and then performs etching the wiring layer 413 via resist after. As another manufacturing method of the first connection wiring 311, laser patterning may be performed by using a laser beam. Through the laser patterning, it is possible to realize highly precise patterning. In addition, although not particularly illustrated, the second connection wiring 312 is also formed in the same way.

Figure 12C:
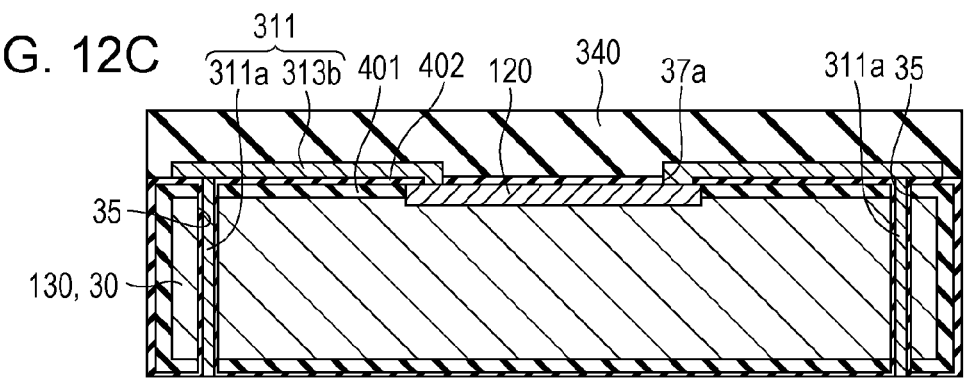

Next, as illustrated in FIG. 12C, the protective film 340 is formed so as to cover the second main surface 302 side of the wafer for driving circuit board 130, that is, the second insulating film 402 and the first connection wiring 311. Here, polyimide is used as the protective film 340. The manufacturing method of the protective film 340 is not particularly limited, for example, a CVD method, a spin coating method, and a sputtering can be used.

Figure 13A:
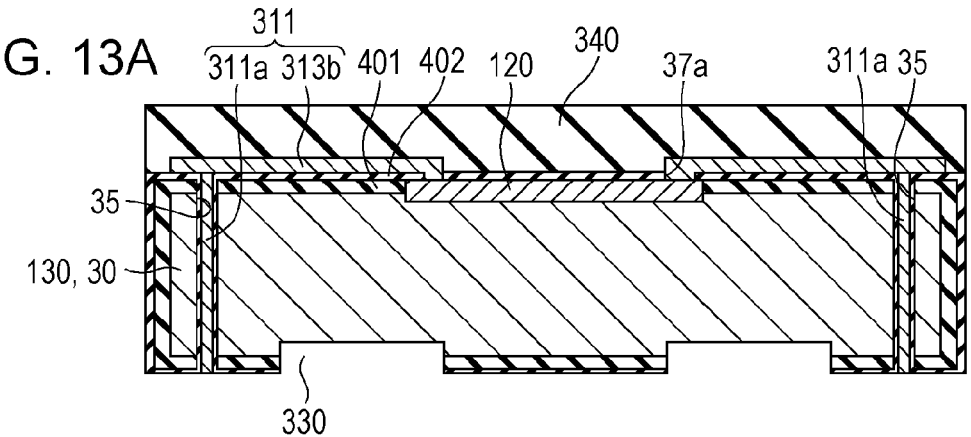
FIGS. 13A to 13C are sectional views illustrating the manufacturing method of the head.

Next, as illustrated in FIG. 13A, the accommodating portion 330 forming the auxiliary wiring 121 is formed on the first main surface 301 side of the wafer for driving circuit board 130. Specifically, a resist layer (particularly not shown) is formed on the entire surface of the first main surface 301, is exposed to light such that the accommodating portion 330 is formed into a predetermined shape, and then the accommodating portion 330 is formed by removing a portion of the resist layer through the anisotropic etching (wet etching) by using an alkaline aqueous solution. Thereafter, the resist layer is removed.

Figure 13B:
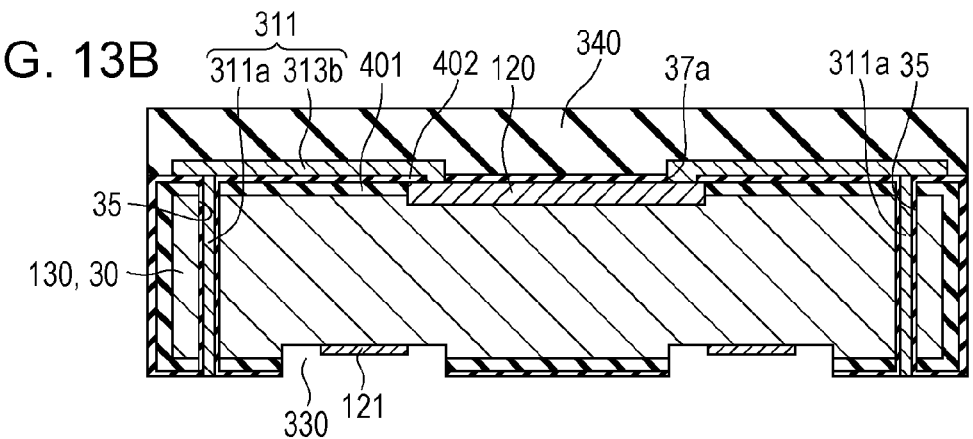

Next, as illustrated in FIG. 13B, the auxiliary wiring 121 is formed in the accommodating portion 330 which is formed on the first main surface 301. Specifically, the resist layer (particularly not shown) is formed on the first main surface 301 side, and the resist layer is exposed to light such that the resist layer is removed except for a predetermined-shaped area corresponding to the auxiliary wiring 121. Then, the auxiliary wiring 121 is formed. A forming method of the auxiliary wiring 121 is not particularly limited; however, it is possible to form the auxiliary wiring 121 by using the same method of the first connection wiring 311 illustrated in FIGS. 12A to 12C.

Figure 13C:
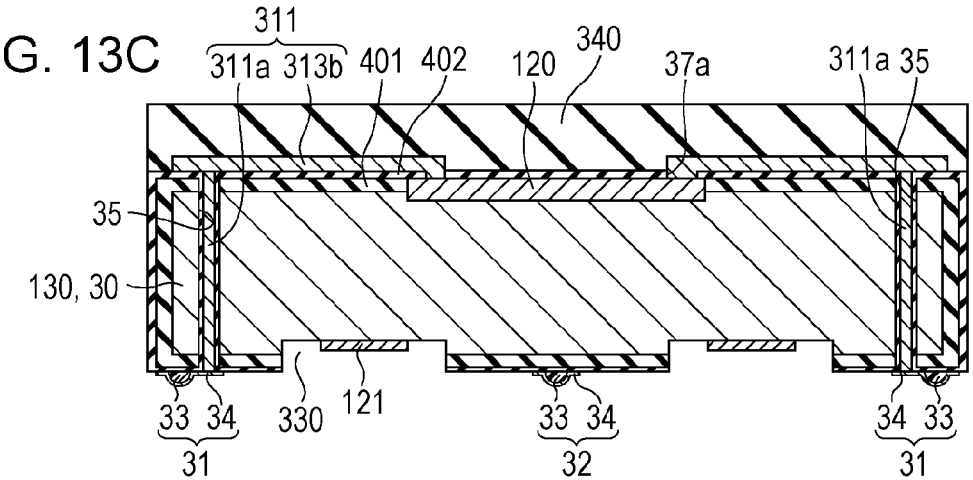

Next, as illustrated in FIG. 13C, the first bump 31 and the second bump 32 are formed. Specifically, the first main surface 301 is coated with a photosensitive insulating resin or a thermosetting insulating resin such as a polyimide resin, an acrylic resin, a phenol resin, a silicone resin, a silicone-modified polyimide resin, and an epoxy resin, and is patterned in a predetermined shape so as to form the core portion 33. Next, the metallic film 34 is formed on the core portion 33. Specifically, the adhesion layer (not shown) is formed though the spattering method and the wiring layer (particularly not shown) which is formed of gold is formed on the adhesion layer. In addition, the first bump 31 and the second bump 32 are formed by patterning the adhesive layer and the wiring layer in a predetermined shape through photolithography.

Disposition of the second bump 32 on the channel formation substrate 10 is not particularly limited; however, the second bump 32 is preferably formed to have a length which is the same as, or is equal to or shorter than the length between two piezoelectric actuator rows 310, that is, the length of the piezoelectric actuator row 310 in the first direction X. With this, the length of the second bump 32 in the first direction X can be short compared with a case where the second bump 32 is provided in an area other than the area between the piezoelectric actuator rows 310, and thus it is possible to reduce the size of the driving circuit board 30 on which the second bump 32 is provided in the first direction X.

In addition, the second bump 32 may be formed on an area extended from the piezoelectric actuator row 310. That is, in the first direction X, the second bump 32 is provided in an area on the outside from the piezoelectric actuator row 310, and the common wiring 92 may be formed from the second electrode 80 which is the common electrode, to a position facing the second bump 32.

Here, the process illustrated in FIGS. 13A to 13C may be performed by changing the order thereof. As illustrated in FIG. 14A, first, the first bump 31 and the second bump 32 are formed (corresponding to FIG. 13C). Next, as illustrated in FIG. 14B, the accommodating portion 330 is formed (corresponding to FIG. 13A). In addition, as illustrated in FIG. 14C, the auxiliary wiring 121 is formed in the accommodating portion 330 (corresponding to FIG. 13B).

Figure 15A:
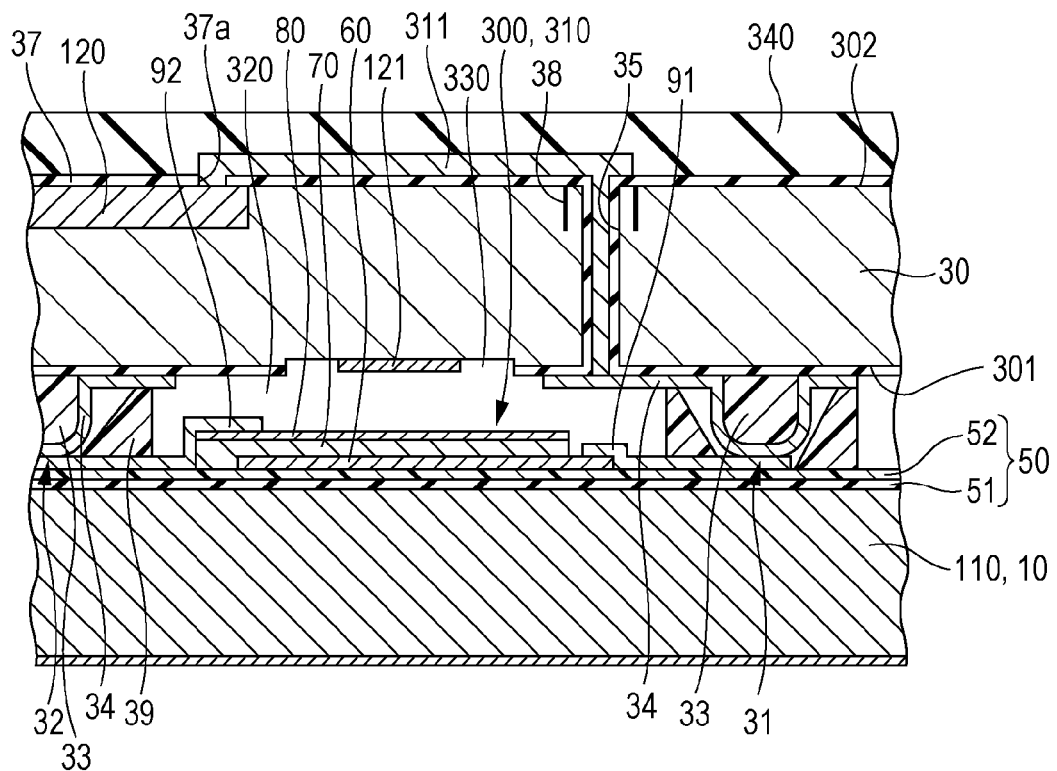
FIGS. 15A and 15B are sectional views illustrating the manufacturing method of the head.

As illustrated in FIG. 15A, the wafer for driving circuit board 130 which is manufactured by the above-described process is bonded to the piezoelectric actuator 300 side of the channel formation substrate wafer 110 via the adhesive layer 39. With this, the individual wiring 91 and the common wiring 92 are connected to the first connection wiring 311 and the second connection wiring 312 via the first bump 31 and the second bump 32. Meanwhile, the first insulating film 401 and the second insulating film 402 are integrally formed as the insulating film 37.

Figure 15B:
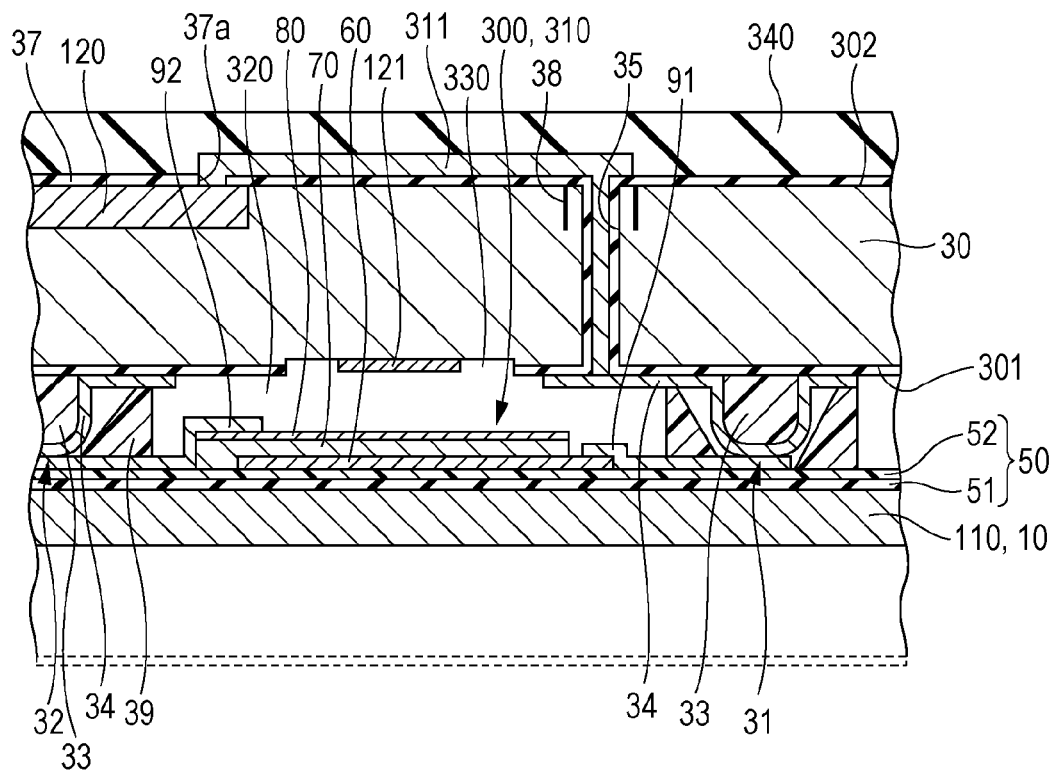

Next, as illustrated in FIG. 15B, the thickness of the channel formation substrate wafer 110 to which the wafer for driving circuit board 130 is bonded is thinned to be a predetermined thickness.

Figure 16A:
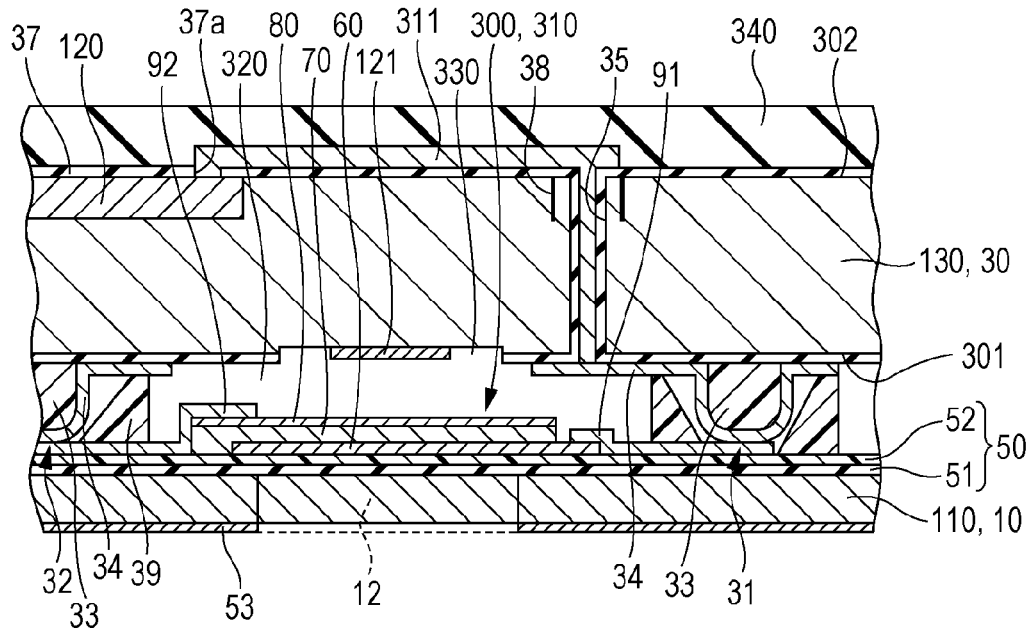
FIGS. 16A and 16B are sectional views illustrating the manufacturing method of the head.

Next, as illustrated in FIG. 16A, a mask film 53 is newly formed on the channel formation substrate wafer 110, and is patterned in a predetermined shape.

Figure 16B:
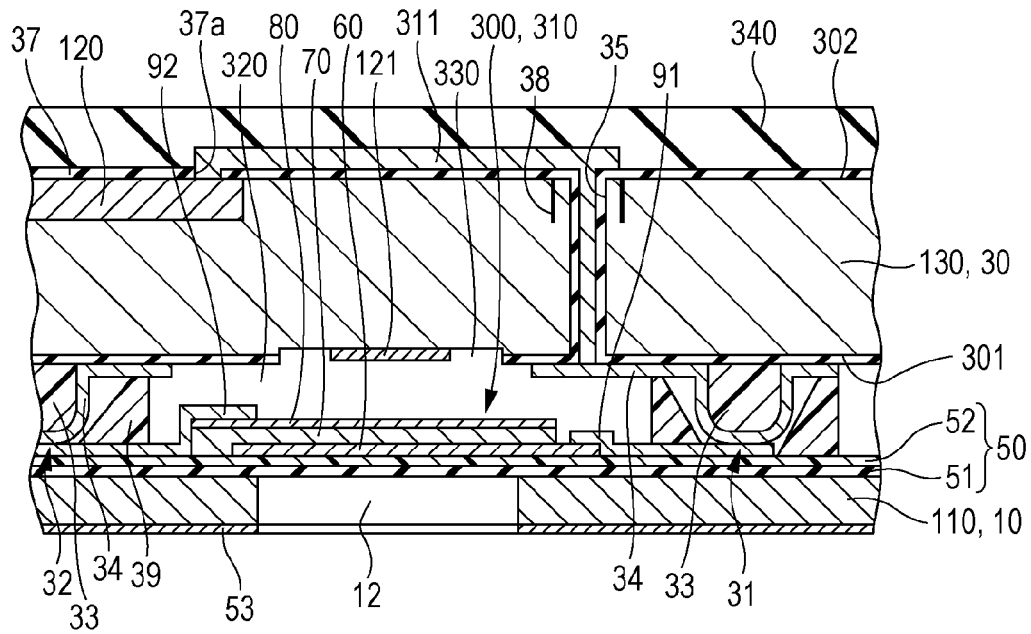

Next, as illustrated in FIG. 16B, the pressure generating chamber 12, an ink supply path 13, and a communicating path 14 are formed so as to correspond to the piezoelectric actuator 300 by performing the anisotropic etching (wet etching) on the channel formation substrate wafer 110 by using the alkaline aqueous solution via the mask film 53.

Thereafter, the nozzle plate 20 on which the nozzle opening 21 is bored is bonded to the surface of the channel formation substrate wafer 110 which is on the side opposite to the wafer for driving circuit board 130, and the compliance board 45 is bonded to the wafer for driving circuit board 130, and the channel formation substrate wafer 110 or the like is divided into a single chip-sized channel formation substrate 10 or the like as illustrated in FIG. 1, thereby forming the head 1 of the embodiment.

As described above, in the manufacturing method of the head 1 according to the embodiment, the driving circuit 120 is face-up disposed, and thus an area for providing the input portion which is connected to the external wiring from the external control circuit in the driving circuit 120 is not required. Accordingly, the area for providing such an input portion is not required to be provided in the driving circuit board 30, and thus it is possible to reduce the size of the driving circuit board 30. In addition, the first connection wiring 311 and the second connection wiring 312 are extended in the third direction Z passing through the driving circuit board 30, and thus it is possible to prevent the driving circuit board 30 from being enlarged on the horizontal surface.

According to the manufacturing method of the head 1 in the embodiment, it is possible to reduce the size of the head 1 by reducing the size of the driving circuit board 30. In addition, since it is possible to reduce the size of the head 1, it is possible to manufacture the head 1 which can correspond to high the nozzle opening 21 with high density and discharge ink with high density.

In addition, in the embodiment, the first connection wiring 311 and the second connection wiring 312, and the individual wiring 91 and the common wiring 92 can be electrically bonded only by bonding the driving circuit board 30 on which the first bump 31 and the second bump 32, and the first connection wiring 311 and the second connection wiring 312 are formed in advance to the channel formation substrate 10. With this, it is possible to simplify the manufacturing process as compared to a case where the connection wiring is connected to the electrode lead which is drawn to the outside of the holding portion 320 by forming a film and a lithography method after the channel formation substrate 10 and the driving circuit board 30 are bonded to each other.

Embodiment 2

Figure 17:
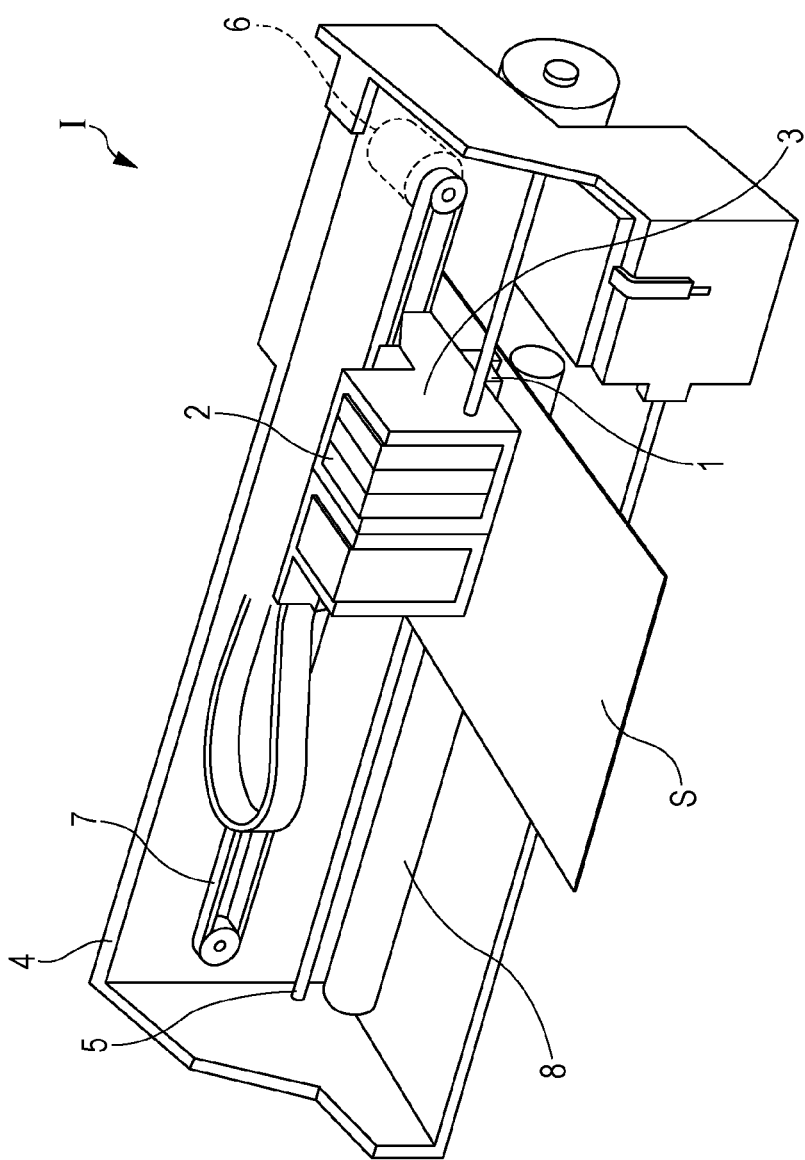
FIG. 17 is a schematic view illustrating an example of an ink jet type recoding apparatus.

A head 1 in Embodiment 2 is mounted on an ink jet type recoding apparatus which is an example of a liquid ejecting apparatus. FIG. 17 is a schematic view illustrating an example of an ink jet type recoding apparatus.

In an ink jet type recoding apparatus I, the head 1 is provided with a detachable cartridge 2 forming a supply unit, and a carriage 3 which is mounted on the head 1 is provided to be freely movable in the axial direction of a carriage axis 5 attached to an apparatus main body 4.

In addition, when a driving force of a driving motor 6 is transferred to the carriage 3 via a plurality of gears (not shown) and the timing belt 7, the carriage 3 mounted on the head 1 is moved along the carriage axis 5. On the other hand, a transporting roller 8 is provided in the apparatus main body 4 as a transporting unit, and a recording sheet S which is a recording medium such as a sheet is transported by the transporting roller 8. Meanwhile, the transporting unit that transports the recording sheet S may be a belt or a drum without being limited to the transporting roller.

In addition, in the above-described ink jet type recoding apparatus I, the head 1 is mounted on the carriage 3 and moved in a main scanning direction; however, a configuration of the ink jet type recoding apparatus I is not particularly limited thereto. For example, a so-called line-type recording apparatus, which performs printing such that the head 1 is fixed and the recording sheet S such as a sheet is moved in a sub scanning direction, is applicable to the invention.

In addition, in the above-described example, the ink jet type recoding apparatus I has a configuration that the cartridge 2 which is a liquid storage portion is mounted on the carriage 3; however, a configuration of the ink jet type recoding apparatus I is not particularly thereto. For example, a configuration such that the liquid storage portion such as an ink tank is fixed to the apparatus main body 4, and the storage portion and the head 1 are connected to each other via a supply tube such as a tube may be employed. In addition, the liquid storage portion may not be mounted on the ink jet type recoding apparatus.

Other Embodiments

As described, one embodiment of the invention is described; however, a basic configuration of the invention is not limited.

In the above-described Embodiment 1, the first bump 31 and the second bump 32 are provided on the driving circuit board 30; however, the invention is not necessarily limited to such a configuration. The first bump 31 and the second bump 32 may not be provided on the channel formation substrate 10 side. In this case, even in a case where the first bump and the second bump are provided on any one of the channel formation substrate, the vibrating plate on the channel formation substrate, the individual electrode forming the piezoelectric actuator, the piezoelectric layer, and the common electrode, the first bump and the second bump correspond to the first bump and the second bump which are provided on the actuator substrate described in aspects.

In Embodiment 1, the second bump 32 is provided between two piezoelectric actuator rows 310; however, the invention is not limited to this configuration. For example, it is possible to provide the driving circuit board 30 or the channel formation substrate 10 in a certain position. For example, the second bump 32 may be provided in an area on a line extended to the piezoelectric actuator row 310. That is, a configuration such that the second bump 32 is provided in an area on the outside from the piezoelectric actuator row 310 in the first direction X, and the common wiring 92 is provided from the second bump 32 to a position facing the second bump 32.

In Embodiment 1, one driving circuit 120 is provided with respect to the two rows of the piezoelectric actuators 300; however, the invention is not particularly limited thereto. For example, the driving circuit 120 may be provided for each row of the piezoelectric actuators 300.

The adhesive layer 39 is provided on both sides in each of the three bumps including two first bumps 31 and one second bump 32 in the second direction Y; however, the invention is not particularly limited thereto. The adhesive layer 39 may be provided on both sides of the first bump 31.

In addition, in the above-described Embodiment 1, one driving circuit board 30 is provided with respect to one channel formation substrate 10; however, the invention is not particularly limited thereto. For example, the driving circuit board 30 may be provided for each piezoelectric actuator row 310. That is, two driving circuit boards 30 may be provided with respect to one channel formation substrate 10.

In Embodiment 1, the common wiring 92 is drawn from the second electrode 80 which is the common electrode of the two piezoelectric actuator rows 310. That is, the common wiring 92 is a wiring common to the two piezoelectric actuator rows 310; however, the invention is not particularly limited thereto. For example, the common wiring 92 may be drawn from each of the second electrodes 80 of the piezoelectric actuator row 310. That is, a configuration such that the common wirings 92 which are respectively drawn from one piezoelectric actuator rows 310 and the other piezoelectric actuator row 310 are respectively connected to the second bump 32 may be employed. Meanwhile, it is preferable that the common wiring 92 is common to the two piezoelectric actuator rows 310. With the common wiring 92 is common to the two piezoelectric actuator rows 310, it is possible to reduce the number of the second connection wirings 312 which are connected to the common wiring 92 via the second bump 32 and the second through holes 36 compared with a case of the individual common wiring 92.

In Embodiment 1, the second bump 32 is provided with the metallic film 34, which is extended in the first direction X so as to cover the core portion 33, on the core portion 33 which is extended along the first direction X; however, the invention is not limited thereto. For example, the second bump 32 may be provided for each common wiring 92. That is, similar to a case where the plurality of first bumps 31 are provided for each individual wiring 91, the second bump may be provided for each of the plurality of common wirings 92. In this case, the second through hole 36 is formed for each second bump 32, and the second connection wiring 312 is provided so as to be connected to the driving circuit 120.

In Embodiment 1, two second through holes 36 are provided on both sides of the second bump 32 in the first direction X; however, the invention is not limited thereto, for example, a position and the number of components are optional.

In addition, in the Embodiment 1 and Embodiment 2, the thin film-type piezoelectric actuator 300 is described as a driving element which causes the pressure change to occur in the pressure generating chamber 12; however, the invention is not particularly limited thereto. For example, it is possible to use a thick film-type piezoelectric actuator which is formed through a method of bonding a green sheet, or a longitudinal vibration-type piezoelectric actuator which expands and contracts in the axial direction by alternately laminating a piezoelectric material and an electrode forming material. In addition, as the driving element, it is possible to use an actuator which disposes a heating element in the pressure generating chamber, and discharges the liquid droplet from the nozzle opening by bubbles generated by heat from the heating element, or a so-called electrostatic actuator which generates static electricity between a diaphragm and an electrode, and deforms the vibration plate by the static electricity so as to eject droplets from nozzle openings.

The invention relates to a broadly general head, for example, the invention is applicable to various types of ink jet recording heads used in an image recording apparatus such as a printer, a color material ejecting head used for manufacturing a color filter such as a liquid crystal display, an electrode material ejecting head used for forming electrodes such as an organic EL display and a field emission display (FED), and a bioorganic material ejecting head used to manufacture a bio chip.

What is claimed is:
1. A head comprising:
an actuator substrate which has two piezo element rows arranged in a second direction which intersects with a first direction, each of the piezo element rows being formed of piezo elements arranged in the first direction, the piezo element causing a pressure change to occur in a pressure generating chamber communicating with a nozzle opening for ejecting a liquid;
a driving circuit board which is provided with a driving circuit for driving the piezo element on a second main surface on the side opposite to a first main surface facing the actuator substrate; and
a first bump and a second bump which are provided on any one of the actuator substrate and the driving circuit board,
wherein the first bump is provided on the outside of the piezo element row in the second direction, wherein an adhesive layer which bonds the actuator substrate to the driving circuit board is provided on at least both sides of the first bump in the second direction, wherein the piezo element includes an individual electrode which is independently provided corresponding to the pressure generating chamber, a common electrode which is common to the piezo element row, and a piezoelectric layer which is provided between the common electrode and the individual electrode, wherein a plurality of first through holes, which communicate with the first main surface and the second main surface, are provided for each individual electrode, and at least one second through hole, which communicates with the first main surface and the second main surface is provided, corresponding to the common electrode, on the driving circuit board, wherein a first connection wiring and a second connection wiring which connect the driving circuit and the piezo element are provided in the first through hole and the second through hole, and wherein the individual electrode and the first connection wiring are electrically connected through the first bump, and the common electrode and the second connection wiring are electrically connected through the second bump, wherein the adhesive layer is provided on both sides of the second bump in the second direction.

2. The head according to claim 1, wherein the second bump is provided between the piezo element rows.

3. A liquid ejecting apparatus comprising the head according to claim 2.

4. A liquid ejecting apparatus comprising the head according to claim 1.

5. A head comprising:

an actuator substrate which has two piezo element rows arranged in a second direction which intersects with a first direction, each of the piezo element rows being formed of piezo elements arranged in the first direction, the piezo element causing a pressure change to occur in a pressure generating chamber communicating with a nozzle opening for ejecting a liquid;

a driving circuit board which is provided with a driving circuit for driving the piezo element on a second main surface on the side opposite to a first main surface facing the actuator substrate; and a first bump and a second bump which are provided on any one of the actuator substrate and the driving circuit board, wherein the first bump is provided on the outside of the piezo element row in the second direction, wherein an adhesive layer which bonds the actuator substrate to the driving circuit board is provided on at least both sides of the first bump in the second direction, wherein the piezo element includes an individual electrode which is independently provided corresponding to the pressure generating chamber, a common electrode which is common to the piezo element row, and a piezoelectric layer which is provided between the common electrode and the individual electrode, wherein a plurality of first through holes, which communicate with the first main surface and the second main surface, are provided for each individual electrode, and at least one second through hole, which communicates with the first main surface and the second main surface is provided, corresponding to the common electrode, on the driving circuit board, wherein a first connection wiring and a second connection wiring which connect the driving circuit and the piezo element are provided in the first through hole and the second through hole, and wherein the individual electrode and the first connection wiring are electrically connected through the first bump, and the common electrode and the second connection wiring are electrically connected through the second bump, wherein a surface of the driving circuit board on the actuator substrate side, an accommodating portion having a recessed shape faces the piezo element row and is extended in the second direction, and wherein a wiring is formed in the accommodating portion.

6. A liquid ejecting apparatus comprising the head according to claim 5.

7. A head comprising:

an actuator substrate which has two piezo element rows arranged in a second direction which intersects with a first direction, each of the piezo element rows being formed of piezo elements arranged in the first direction, the piezo element causing a pressure change to occur in a pressure generating chamber communicating with a nozzle opening for ejecting a liquid;

a driving circuit board which is provided with a driving circuit for driving the piezo element on a second main surface on the side opposite to a first main surface facing the actuator substrate; and a first bump and a second bump which are provided on any one of the actuator substrate and the driving circuit board, wherein the first bump is provided on the outside of the piezo element row in the second direction, wherein an adhesive layer which bonds the actuator substrate to the driving circuit board is provided on at least both sides of the first bump in the second direction, wherein the piezo element includes an individual electrode which is independently provided corresponding to the pressure generating chamber, a common electrode which is common to the piezo element row, and a piezoelectric layer which is provided between the common electrode and the individual electrode, wherein a plurality of first through holes, which communicate with the first main surface and the second main surface, are provided for each individual electrode, and at least one second through hole, which communicates with the first main surface and the second main surface is provided, corresponding to the common electrode, on the driving circuit board, wherein a first connection wiring and a second connection wiring which connect the driving circuit and the piezo element are provided in the first through hole and the second through hole, and wherein the individual electrode and the first connection wiring are electrically connected through the first bump, and the common electrode and the second connection wiring are electrically connected through the second bump, wherein, the second bump is extended in the first direction, and wherein at least two second through holes are formed on the outside from both ends of the second bump in the first direction.

8. A liquid ejecting apparatus comprising the head according to claim 7.

* * * * *